United States Patent
Min et al.

(10) Patent No.: US 9,070,448 B2
(45) Date of Patent: Jun. 30, 2015

(54) METHODS OF FORMING FINE PATTERNS IN SEMICONDUCTOR DEVICES

(71) Applicants: Jae-Ho Min, Youngin-si (KR); O-Ik Kwon, Sungnam-si (KR); Bum-Soo Kim, Suwon-si (KR); Dong-Chan Kim, Seoul (KR); Myeong-Cheol Kim, Suwon-si (KR)

(72) Inventors: Jae-Ho Min, Youngin-si (KR); O-Ik Kwon, Sungnam-si (KR); Bum-Soo Kim, Suwon-si (KR); Dong-Chan Kim, Seoul (KR); Myeong-Cheol Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/334,984

(22) Filed: Jul. 18, 2014

(65) Prior Publication Data

US 2014/0328125 A1 Nov. 6, 2014

Related U.S. Application Data

(63) Continuation of application No. 14/133,296, filed on Dec. 18, 2013, which is a continuation of application No. 13/242,504, filed on Sep. 23, 2011, now Pat. No. 8,637,407, which is a continuation of application No. 12/428,963, filed on Apr. 23, 2009, now Pat. No. 8,110,506.

(30) Foreign Application Priority Data

Aug. 27, 2008 (KR) ........................ 10-2008-0078519

(51) Int. Cl.
*H01L 29/76* (2006.01)
*H01L 23/48* (2006.01)
(Continued)

(52) U.S. Cl.
CPC ........ *G11C 16/0483* (2013.01); *H01L 21/0337* (2013.01); *H01L 21/3086* (2013.01);
(Continued)

(58) Field of Classification Search
CPC ..................... H01L 27/11524; H01L 27/0207; H01L 27/1157

USPC .................................................. 257/314, 773
See application file for complete search history.

(56) References Cited

U.S. PATENT DOCUMENTS 5,068,202 A 11/1991 Crotti et al.
5,468,578 A 11/1995 Rolfson
(Continued)

FOREIGN PATENT DOCUMENTS

CN 101055837 A 10/2007
CN 101114571 A 1/2008
(Continued)

OTHER PUBLICATIONS

Chinese First Office Action Corresponding to Chinese Patent Application No. 200910163305.3 ; Date of Issuance: Jan. 31, 2013; 12 pages (Foreign text only).
(Continued)

*Primary Examiner* — Nicholas Tobergte
(74) *Attorney, Agent, or Firm* — Myers Bigel Sibley & Sajovec, P.A.

(57) ABSTRACT

Methods of forming a semiconductor device may include providing a feature layer having a first region and a second region. The methods may also include forming a dual mask layer on the feature layer. The methods may further include forming a variable mask layer on the dual mask layer. The methods may additionally include forming a first structure on the feature layer in the first region and a second structure on the feature layer in the second region by patterning the variable mask layer and the dual mask layer. The methods may also include forming a first spacer on a sidewall of the first structure and a second spacer on a sidewall of the second structure. The methods may further include removing the first structure while maintaining at least a portion of the second structure.

20 Claims, 29 Drawing Sheets

(51) Int. Cl.
  *G11C 16/04* (2006.01)
  *H01L 21/033* (2006.01)
  *H01L 21/308* (2006.01)
  *H01L 21/3213* (2006.01)
  *H01L 27/115* (2006.01)
  *G11C 5/06* (2006.01)
  *H01L 27/02* (2006.01)

(52) U.S. Cl.
  CPC .... *H01L21/32139* (2013.01); *H01L 27/11526* (2013.01); *H01L 27/11548* (2013.01); *H01L 27/11573* (2013.01); *H01L 27/11575* (2013.01); *H01L 27/11531* (2013.01); *G11C 5/06* (2013.01); *H01L 27/0207* (2013.01); *H01L 27/11524* (2013.01); *H01L 27/1157* (2013.01)

(56) References Cited

U.S. PATENT DOCUMENTS

| | | | |
|---|---|---|---|
| 6,331,733 B1 | 12/2001 | Or-Bach et al. | |
| 6,475,891 B2 | 11/2002 | Moon | |
| 6,710,364 B2 | 3/2004 | Guldi et al. | |
| 6,723,607 B2 | 4/2004 | Nam et al. | |
| 6,777,307 B1 | 8/2004 | Ramkumar et al. | |
| 7,018,894 B2 * | 3/2006 | Shin et al. | 438/257 |
| 7,084,440 B2 | 8/2006 | Sel et al. | |
| 7,115,525 B2 | 10/2006 | Abatchev et al. | |
| 7,253,118 B2 | 8/2007 | Tran et al. | |
| 7,285,815 B2 * | 10/2007 | Shin et al. | 257/314 |
| 7,446,352 B2 | 11/2008 | Becker et al. | |
| 7,510,973 B2 | 3/2009 | Kong | |
| 7,575,972 B2 * | 8/2009 | Dong | 438/257 |
| 7,649,779 B2 * | 1/2010 | Ruttkowski et al. | 365/185.18 |
| 7,671,475 B2 * | 3/2010 | Kamigaichi et al. | 257/773 |
| 7,709,396 B2 | 5/2010 | Bencher et al. | |
| 7,723,807 B2 * | 5/2010 | Nishiyama | 257/401 |
| 7,824,841 B2 | 11/2010 | Jung | |
| 7,826,245 B2 * | 11/2010 | Kato et al. | 365/51 |
| 7,885,114 B2 | 2/2011 | Park et al. | |
| 7,959,818 B2 | 6/2011 | Jung | |
| 8,110,506 B2 | 2/2012 | Min et al. | |
| 8,213,231 B2 * | 7/2012 | Park et al. | 365/185.17 |
| 8,216,947 B2 | 7/2012 | Lee et al. | |
| 8,455,359 B2 * | 6/2013 | Kim et al. | 438/672 |
| 8,637,407 B2 | 1/2014 | Min et al. | |
| 2001/0052614 A1 | 12/2001 | Ishibashi | |
| 2002/0022311 A1 | 2/2002 | Takeuchi et al. | |
| 2002/0068447 A1 | 6/2002 | Moon | |
| 2003/0042223 A1 | 3/2003 | Toyosaki et al. | |
| 2003/0062550 A1 | 4/2003 | Sekiguchi et al. | |
| 2003/0227063 A1 | 12/2003 | Sei et al. | |
| 2006/0001019 A1 | 1/2006 | Sandhu et al. | |
| 2006/0199332 A1 | 9/2006 | Park et al. | |
| 2007/0096187 A1 | 5/2007 | Lee | |
| 2007/0123053 A1 | 5/2007 | Kim et al. | |
| 2007/0200182 A1 | 8/2007 | Liaw | |
| 2007/0210449 A1 | 9/2007 | Caspary et al. | |
| 2007/0238053 A1 | 10/2007 | Hashimoto | |
| 2008/0006869 A1 | 1/2008 | Kamigaichi et al. | |
| 2008/0017992 A1 | 1/2008 | Kito et al. | |
| 2008/0131793 A1 | 6/2008 | Lee et al. | |
| 2008/0206686 A1 | 8/2008 | Lee et al. | |
| 2008/0220600 A1 | 9/2008 | Alapati et al. | |
| 2008/0296737 A1 | 12/2008 | Weis et al. | |
| 2009/0288867 A1 | 11/2009 | Tu et al. | |
| 2010/0012981 A1 | 1/2010 | Becker et al. | |
| 2010/0090349 A1 | 4/2010 | Park et al. | |
| 2010/0167214 A1 | 7/2010 | Yoon et al. | |
| 2010/0193960 A1 | 8/2010 | Mashita et al. | |
| 2011/0068439 A1 | 3/2011 | Tsai et al. | |
| 2011/0266647 A1 | 11/2011 | Parekh et al. | |
| 2013/0105983 A1 * | 5/2013 | Min et al. | 257/773 |
| 2013/0270716 A1 * | 10/2013 | Kim et al. | 257/775 |

FOREIGN PATENT DOCUMENTS

| | | |
|---|---|---|
| CN | 101164147 A | 4/2008 |
| CN | 101271826 A | 9/2008 |
| JP | 63-124419 | 5/1998 |
| JP | 2002-540626 A | 11/2002 |
| JP | 2006-032894 | 2/2006 |
| JP | 2006-261440 | 9/2006 |
| JP | 2007-305970 | 11/2007 |
| JP | 2008-027978 | 2/2008 |
| JP | 2008-027991 | 2/2008 |
| JP | 2008-108788 | 5/2008 |
| JP | 2010-503995 | 2/2010 |
| JP | 2010-520639 | 6/2010 |
| KR | 1020060135126 | 12/2006 |
| KR | 1020070071083 | 7/2007 |
| TW | 200814146 A | 3/2008 |
| TW | 200825627 A | 6/2008 |
| TW | 200828430 A | 7/2008 |
| WO | WO 2008/033695 A2 | 3/2008 |
| WO | WO 2008/018921 A1 | 9/2008 |

OTHER PUBLICATIONS

Chinese First Office Action Corresponding to Chinese Patent Application No. 200910207744; Date of Issuance: Feb. 27, 2013; 10 pages (foreign text only).

Japanese Office Action corresponding to Japanese Patent Application No. 2009-185678; Mailing Date: Mar. 19, 2013, 5 pages (foreign text only).

* cited by examiner

METHODS OF FORMING FINE PATTERNS IN SEMICONDUCTOR DEVICES

CROSS-REFERENCE TO RELATED APPLICATIONS

The present application is a continuation of and claims priority from U.S. patent application Ser. No. 14/133,296, filed on Dec. 18, 2013, which is a continuation of and claims priority from U.S. patent application Ser. No. 13/242,504, filed on Sep. 23, 2011 (Issued as U.S. Pat. No. 8,637,407), which is a continuation of and claims priority from U.S. patent application Ser. No. 12/428,963, filed on Apr. 23, 2009 (Issued as U.S. Pat. No. 8,110,506), which claims priority under 35 U.S.C. §119 to Korean Patent Application No. 10-2008-0078519, filed in the Korean Intellectual Property Office on Aug. 27, 2008, the disclosures of which are hereby incorporated by reference herein in their entireties. This application is also related to U.S. patent application Ser. No. 12/418,023, filed Apr. 3, 2009.

FIELD

The present inventive concept relates to the field of semiconductors in general, and more particularly, to method of forming semiconductor devices.

BACKGROUND

As semiconductor devices have become more highly integrated, the size of features in the semiconductor devices and the spacings therebetween have been reduced. One of the ways that these semiconductor devices have been more highly integrated is through the use of a photolithography process sometimes referred to as self-aligned reverse patterning. According to self-aligned reverse patterning approach, a pattern can be formed on a layer in which features (a feature layer) are to be formed. A conformal layer can be formed on the pattern and subsequently removed from the feature layer and the pattern, except that portions of the spacer layer can remain on side walls of the pattern. Then, the pattern can be removed from the feature layer while the portions of the conformal layer remaining on the side walls remain. The remaining portions of the conformal layer can define a mask pattern that can be used to etch a reverse pattern into the feature layer.

SUMMARY

Embodiments according to the inventive concept, a method of forming patterns in a semiconductor device can include simultaneously forming a plurality of patterns, each including respective features having different widths by etching a feature layer using first multiple spacers with a void therebetween and using second multiple spacers with a structure therebetween.

Still further, in some embodiments according to the inventive concept, one of the mask patterns can be formed by removing structures that have side wall spacers formed thereon in one area of the device, whereas a second area of the device includes a structure that is maintained between the sidewall spacers. Accordingly, maintaining the structure in the second area region of the chip and removing the structure in the first region can help to provide the elements having different sizes. In particular, in the first region described above, the elements in the corresponding mask can be defined as the side wall spacers themselves, which are left behind once the structure is removed. Furthermore, the element in the second region of the chip can include both the side wall spacers as well as the structure maintained therebetween. Accordingly, the different elements included in the different patterns in different regions of the chip can have different sizes.

DESCRIPTION OF EMBODIMENTS ACCORDING TO THE INVENTIVE CONCEPT

Figure 1:
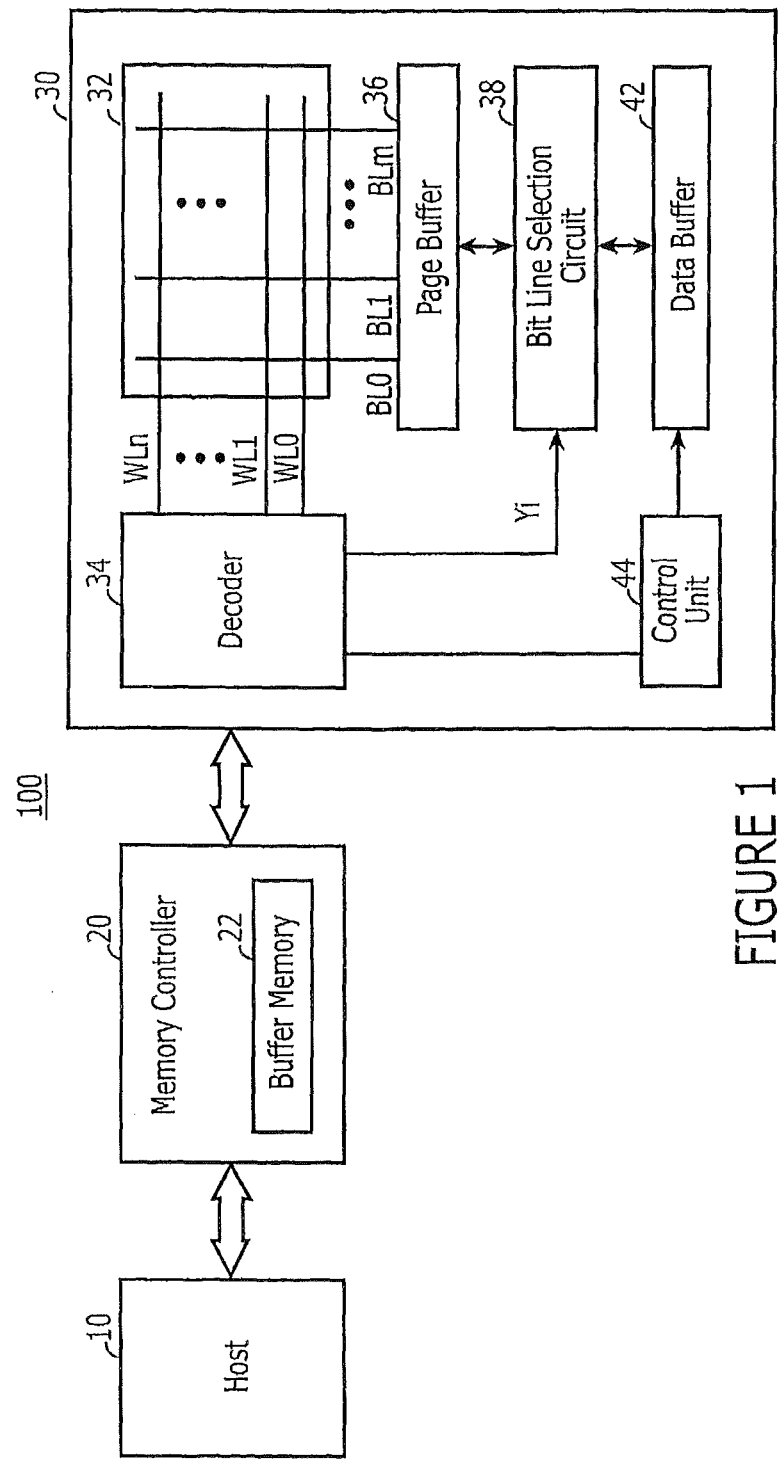
FIG. 1 is a high level block diagram illustrating a system including a non-volatile memory device including a decoder circuit that drives word lines coupled to a cell array also coupled to a page buffer via bitline in some embodiments.

The present inventive concept now will be described more fully hereinafter with reference to the accompanying drawings, in which embodiments of the inventive concept are shown. However, this inventive concept should not be construed as limited to the embodiments set forth herein. Rather, these embodiments are provided so that this disclosure will be thorough and complete, and will fully convey the scope of the inventive concept to those skilled in the art. In the drawings, the thickness of layers and regions may be exaggerated for clarity. Like numbers refer to like elements throughout. As used herein the term "and/or" includes any and all combinations of one or more of the associated listed items and may be abbreviated as "/".

The terminology used herein is for the purpose of describing particular embodiments only and is not intended to be limiting of the inventive concept. As used herein, the singular forms "a," "an" and "the" are intended to include the plural forms as well, unless the context clearly indicates otherwise. It will be further understood that the terms "comprises," "comprising," "having," "having," "includes," and/or "including" when used in this specification, specify the presence of stated features, regions, steps, operations, elements, and/or components, but do not preclude the presence or addition of one or more other features, regions, steps, operations, elements, components, and/or groups thereof.

It will be understood that when an element such as a layer or region is referred to as being "on" or extending "onto" another element (or variations thereof), it can be directly on or extend directly onto the other element or intervening elements may also be present. In contrast, when an element is referred to as being "directly on" or extending "directly onto" another element (or variations thereof), there are no intervening elements present. It will also be understood that when an element is referred to as being "connected" or "coupled" to another element (or variations thereof), it can be directly connected or coupled to the other element or intervening elements may be present. In contrast, when an element is referred to as being "directly connected" or "directly coupled" to another element (or variations thereof), there are no intervening elements present.

It will be understood that, although the terms first, second, etc. may be used herein to describe various elements, components, regions, layers and/or sections, these elements, materials, regions, layers and/or sections should not be limited by these terms. These terms are only used to distinguish one element, material, region, layer or section from another element, material, region, layer or section. Thus, a first element, material, region, layer or section discussed below could be termed a second element, material, region, layer or section without departing from the teachings of the present inventive concept.

Relative terms, such as "lower", "back", and "upper" may be used herein to describe one element's relationship to another element as illustrated in the Figures. It will be understood that relative terms are intended to encompass different orientations of the device in addition to the orientation depicted in the Figures. For example, if the structure in the FIG. 1 is turned over, elements described as being on the "backside" of substrate would then be oriented on "upper" surface of the substrate. The exemplary term "upper", can therefore, encompasses both an orientation of "lower" and "upper," depending on the particular orientation of the figure. Similarly, if the structure in one of the figures is turned over, elements described as "below" or "beneath" other elements would then be oriented "above" the other elements. The exemplary terms "below" or "beneath" can, therefore, encompass both an orientation of above and below.

Embodiments of the present inventive concept are described herein with reference to cross section and perspective illustrations that are schematic illustrations of idealized embodiments of the present inventive concept. As such, variations from the shapes of the illustrations as a result, for example, of manufacturing techniques and/or tolerances, are to be expected. Thus, embodiments of the present inventive concept should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated, typically, may be rounded. Thus, the regions illustrated in the figures are schematic in nature and their shapes are not intended to illustrate the precise shape of a region and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

FIG. 1 is a high level block diagram illustrating a system 100 including a non-volatile memory device 30 including a decoder circuit 34 that drives word lines coupled to a cell array 32 also coupled to a page buffer 36 via bitlines BL0-$m$. It will be understood that the decoder 34 can be used to address selective memory cells within the array 32 upon which data is provided to the page buffer 36 via the bitlines BL0-$m$.

Further, the decoder 34 can control a bitline selection circuit 38, which can select data provided by the page buffer 36 via a control line Yi. The selected data from the bitline selection circuit 38 can be provided through a data buffer 42 that operates under the control of a control unit 44 also directed by the decoder 34.

The non-volatile memory 30 can be controlled by a memory controller circuit 20 including ancillary control circuits configured to operate the non-volatile memory 30 to carry out read and write cycles thereto. The memory controller circuit 20 can also include a buffer memory 22, which can be used to temporarily store data intended to be written to the non-volatile memory 30 as well as the temporarily stored data read from the non-volatile memory 30.

A host system 10 is coupled to the memory controller 20 and can provide high level control on the memory controller circuit 20 to carry out read/write operations to the non-volatile memory 30. It will be understood that embodiments of the inventive concept described herein can be utilized to provide any of the circuitry shown in FIG. 1 as well as circuitry not shown.

As described herein below in greater detail, embodiments according to the inventive concept can provide for the simultaneous formation of a plurality of mask patterns using self aligned reverse patterning where the masks patterns include respective mask pattern elements that have different widths. For example, in some embodiments according to the inventive concept, elements having different widths and/or different spacing therebetween can be formed simultaneously on a feature layer, which is subsequently subject to etching using patterns having different size/space elements therein. Accordingly, the simultaneous formation of the mask patterns having the different sized elements therein can help to reduce the number of steps that may otherwise be employed during the process of forming the semiconductor device.

Still further, in some embodiments according to the inventive concept, one of the mask patterns can be formed by removing structures that have side wall spacers formed thereon in one area of the device, whereas a second area of the device includes a structure that is maintained between the sidewall spacers. Accordingly, maintaining the structure in the second area region of the chip while removing the structure in the first region can help to provide the elements having different sizes. In particular, in the first region described above, the elements in the corresponding mask can be defined as the side wall spacers themselves, which are left behind once the structure is removed. Furthermore, the element in the second region of the chip can include both the side wall spacers as well as the structure maintained therebetween. Accordingly, the different elements included in the different patterns in different regions of the chip can have different sizes.

Figure 2:
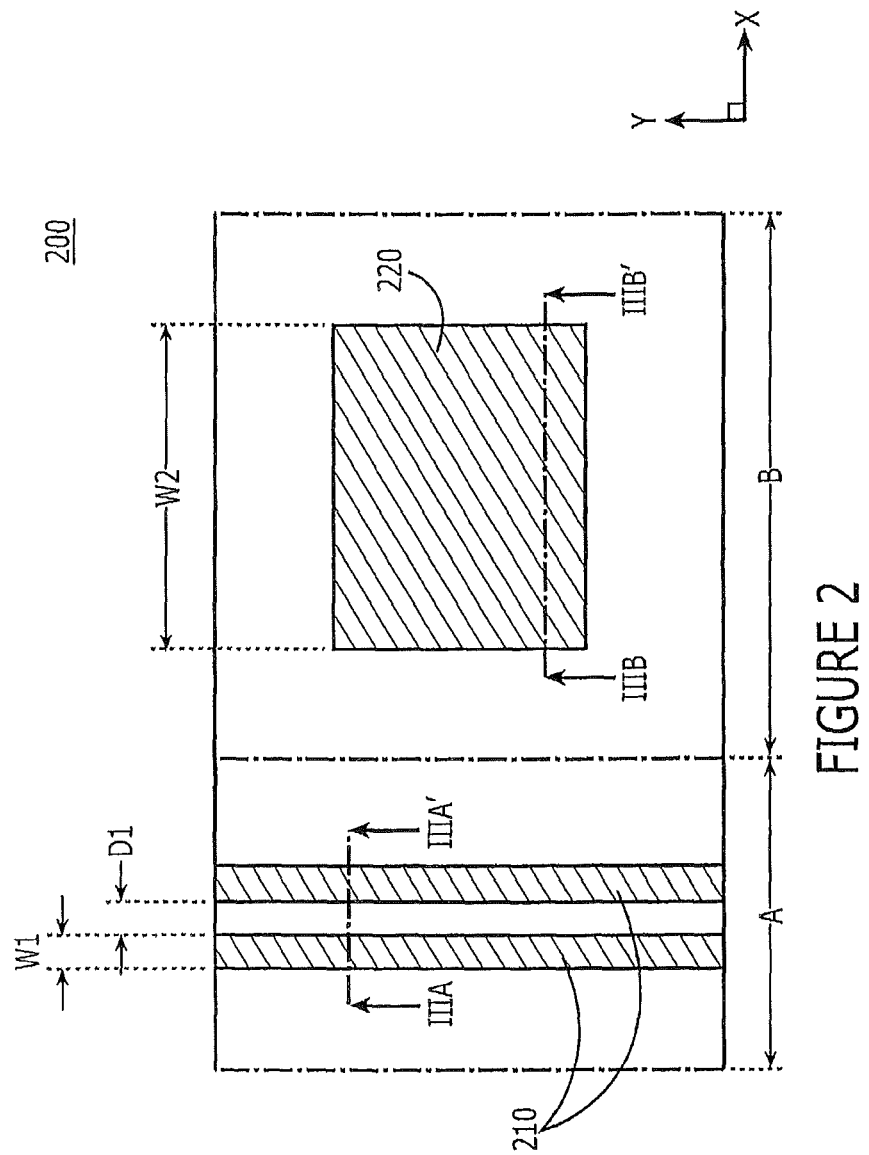
FIG. 2 is a plan view of a semiconductor substrate including two separate regions (a and b) having respective features formed thereon in some embodiments according to the inventive concept.

FIG. 2 is a plan view of a semiconductor device including two separate regions (A and B) having respective features formed thereon in some embodiments according to the inventive concept. In particular, region A of the semiconductor device 200 includes two features 210, wherein each feature has a width W1 and the features 210 are separated by a distance D1. Furthermore, the separate region B of the semiconductor device 200 includes a feature 220 that has a width W2 that is different than the width W1 of the features 210 in region A.

In some embodiments, the region A can denote, for example, a cell array region of the device wherein the features defined therein can be relatively small. In contrast, the region B can denote, for example, a peripheral core or another portion of the cell array region wherein the features are relatively large compared to those included in region A. In particular, features 210 having a width W1 can be relatively small compared to feature 220 shown in region B. Furthermore, in some embodiments according to the inventive concept, the spacing between the features 210 in region A can be the same as the width of those features or, alternatively, the spacing between the features 210 may be less than the width W1 or greater than the width W1. It will be further noted that the features 210 and 220 in the different regions may or may not be electrically connected to one another.

Figure 3:
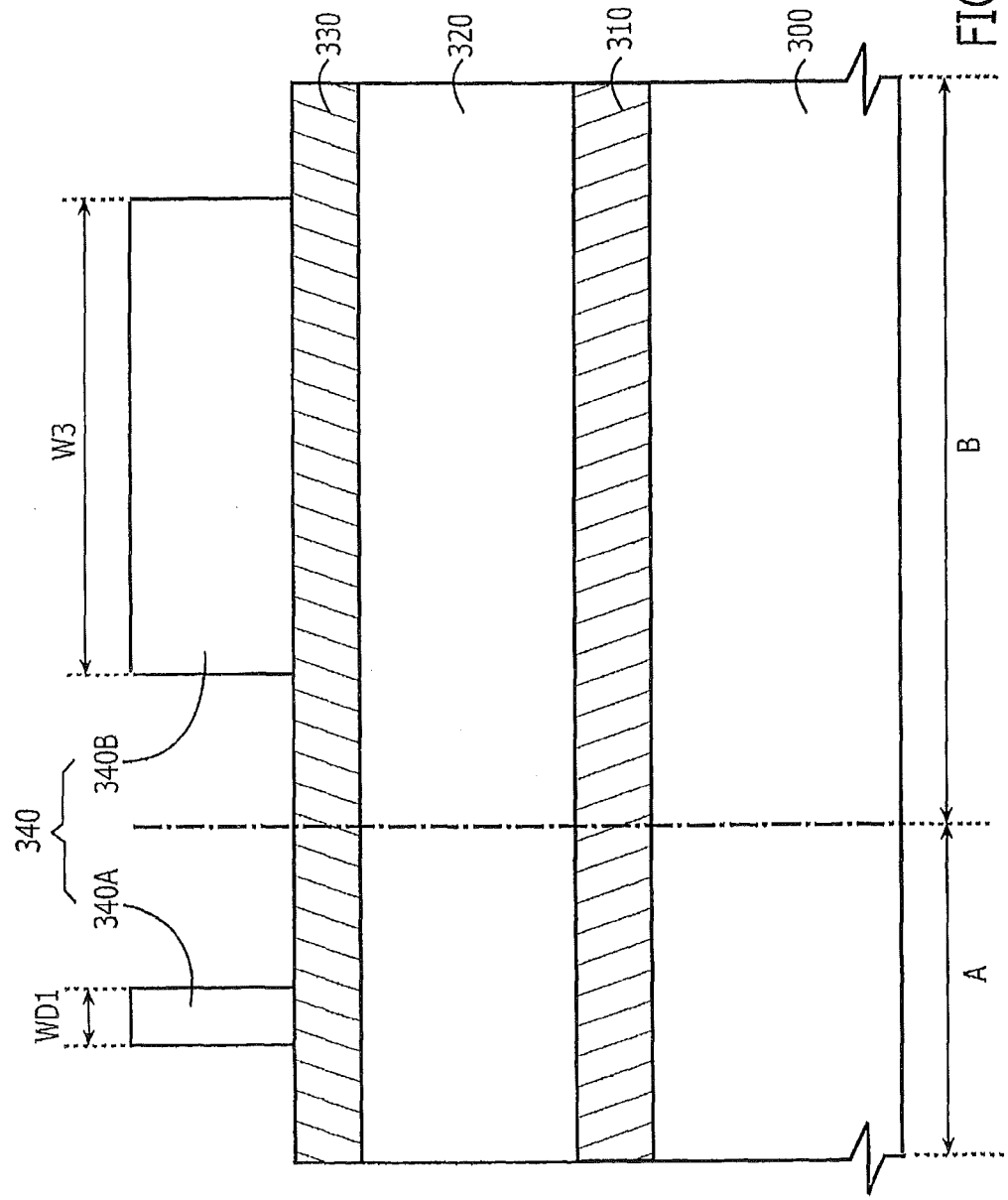
FIGS. 3 and 5-11 are cross sectional views illustrating methods of simultaneously forming a plurality of mask patterns using self aligned reverse patterning in some embodiments according to the inventive concept.

FIG. 3 is a cross sectional view illustrating methods of simultaneously forming a plurality of mask patterns using self aligned reverse patterning in some embodiments according to the inventive concept. Preliminary structures 340A and 340B (referred to collectively sometimes herein as 340) are formed on underlying layers in region A and region B, the preliminary structures 340 may be formed by photolithography process, which can include a variable mask layer 330 that is formed on a dual mask layer 320, which is in turn formed on a feature layer 310, all of which may be supported by a substrate 300 in both regions A and B of the device 200.

It will be understood that the layers shown in FIG. 3 can be formed of different material depending on the particular type of semiconductor device being formed. For example, if the preliminary structures 340 shown in FIG. 3 are being used to ultimately form conductive structures, such as gate electrodes, the feature layer 310 may be material, such as TaN, TiN, W, WN, HfN, $WSi_x$, and combinations thereof. Alternatively, if the features to be formed in the layer 310 are bitlines, the feature layer 310 may be formed of doped polysilicon, a metal, or a metal alloy such as tungsten or aluminum. Alternatively, in some embodiments according to the inventive concept, when defining active regions in substrate 300, the feature layer 310 may be eliminated and the preliminary structures may be used at least initially to define trenches in the substrate. As shown in FIG. 3, the preliminary structures 340 formed in regions A and B are formed to different widths WD1 and WD3 respectively.

Referring still to FIG. 3, the variable mask layer 330 can be formed of a material that has an etch selectivity relative to the dual mask layer 320. For example, in some embodiments according to the inventive concept, the variable mask layer 330 can be formed of SiON, $SiO_2$, $Si_3N_4$, SiCN, polysilicon, a metal, or an organic material. Further, in some embodiments according to the inventive concept, the preliminary structures 340 may be formed using a photolithography process.

As briefly described above, the dual mask layer 320 has an etch selectivity relative to the variable mask layer 330. Furthermore, the dual mask layer 320 can be formed of a material that contains silicon, such as $SiO_2$, $Si_3N_4$, SiCN and/or polysilicon. In still further embodiments according to the inventive concept, the dual mask layer 320 may be formed of an amorphous carbon layer or a carbon containing layer. The dual mask layer 320 may be applied to the feature layer 310 by a spin coating or CVD process. A portion of dual mask layer 320 formed in the region A can be used as a sacrificial layer for forming a plurality of etch mask patterns having multiplied patterns. A portion of dual mask layer formed in the region B can be a portion of an etch mask for forming final patterns.

In some embodiments according to the inventive concept, when the dual mask layer 320 is formed of a carbon containing material, the dual mask layer may be formed of a hydrocarbon compound that includes an aromatic ring or an organic compound that includes a derivative thereof. For example, in some embodiments according to the inventive concept, the dual mask layer 320 can include an organic compound having an aromatic ring such as phenyl benzene, or naphthalene. In still further embodiments according to the inventive concept, the dual mask layer 320 may be a layer that has a relatively high carbon level such as about 85% to about 99% by weight based on the total weight of the organic compound.

Figure 4:
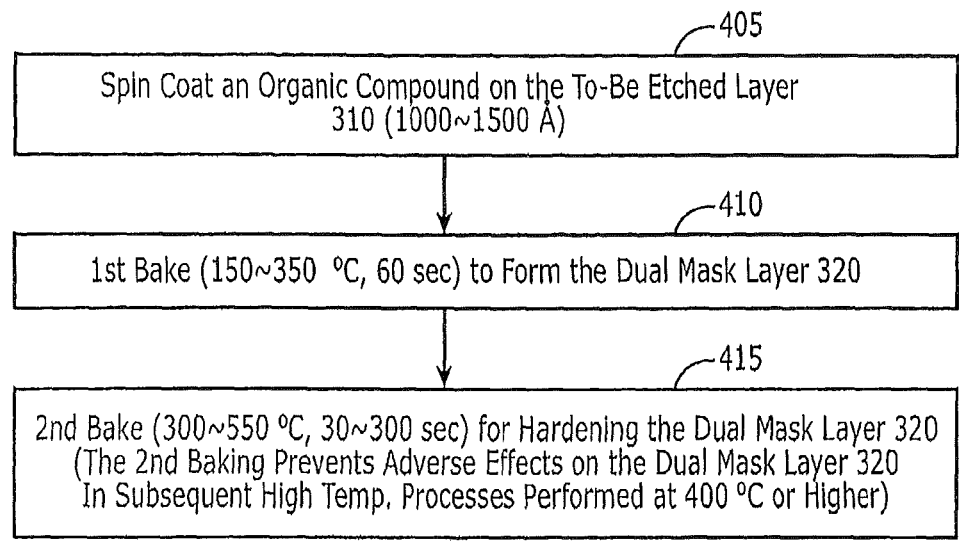
FIG. 4 is a flow chart that illustrates methods of forming the dual mask layer on the feature layer in some embodiments according to the inventive concept.
Figure 5:
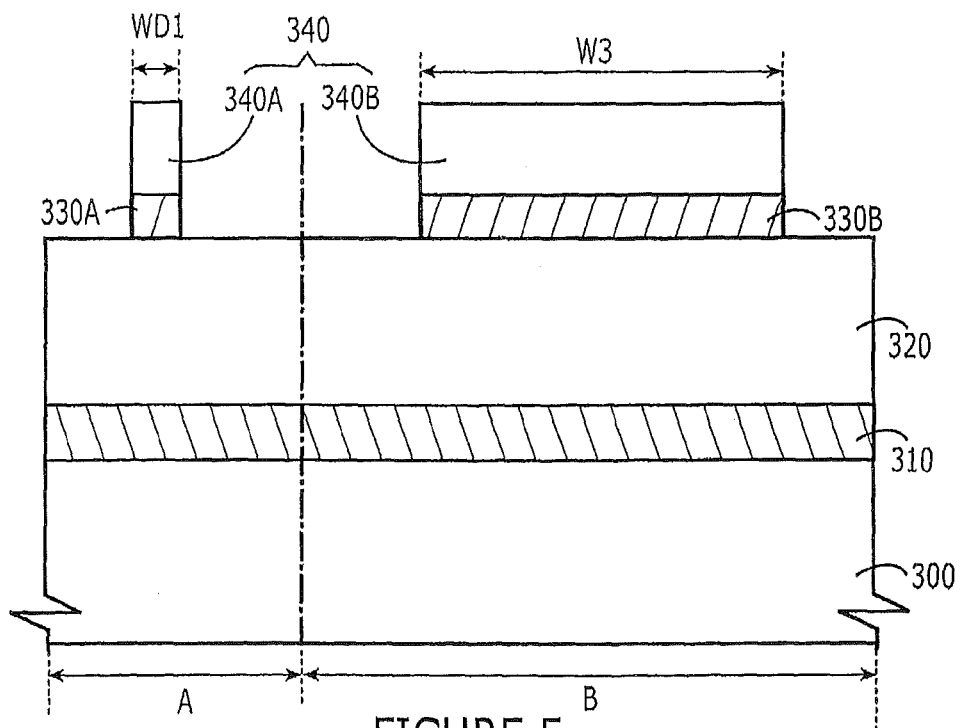

FIG. 4 is a flow chart that illustrates methods of forming the dual mask layer on the feature layer 310 in some embodiments according to the inventive concept. According to FIG. 4, an organic compound is spin coated onto the feature layer 310 to a thickness of about 1000 angstroms to about 1500 angstroms (Block 405). The organic compound on the feature layer 310 is then baked at a temperature of about 150° centigrade to 350° centigrade for about 60 seconds to form the dual mask layer 320 (Block 410).

A second bake is then performed on the dual mask layer at a temperature of about 300° to about 550° for about 30 to about 300 seconds in order to harden the dual mask layer 320, which may help reduce adverse effects on the dual mask layer that may otherwise be caused during subsequent steps in the fabrication of the semiconductor device when, for example, temperatures in excess of 400° centigrade may be applied to the device.

FIG. 5-11 are cross sectional views that illustrate methods of simultaneously forming a plurality of mask patterns using self aligned reverse patterning wherein the mask patterns include elements having different widths in some embodiments according to the inventive concept. According to FIG. 5, the preliminary structures 340 are used to etch the underlying variable mask layer 330 to expose portions of the dual mask layer 320. As further shown in FIG. 5, the remaining portions of the variable mask layer 330A and 330B underlying the preliminary structures 340 conform to the profiles of the preliminary structures 340 and therefore have about the same width WD1 and WD3 respectively. In some embodiments according to the inventive concept, the thickness of the preliminary structures 340 may be reduced while the etching of the variable mask layer 330 occurs.

Figure 6:
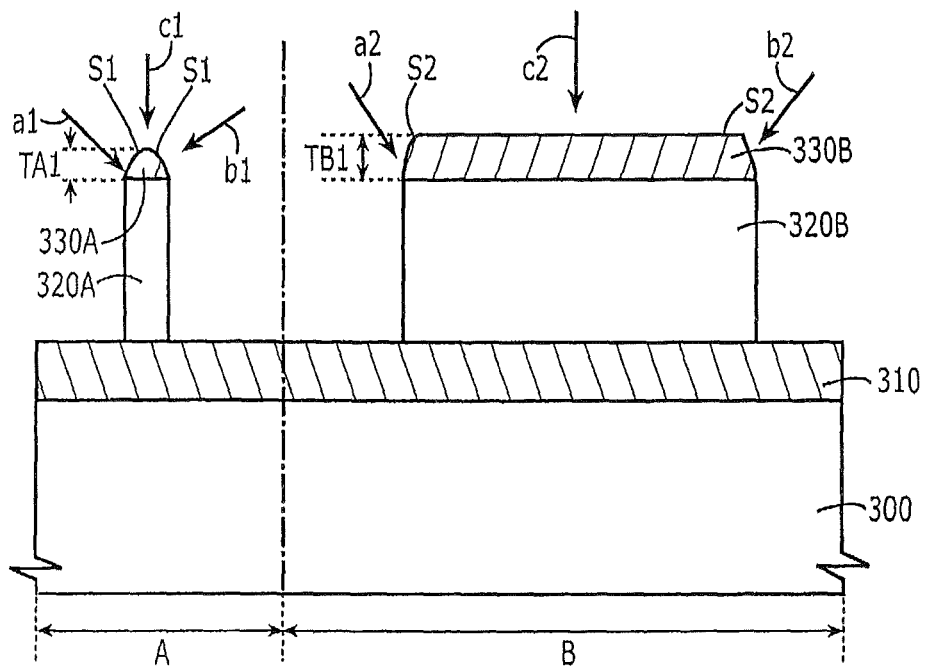

According to FIG. 6, the preliminary structures 340 are removed from the portions of the variable mask layer 330A, 330B so that these remaining portions define variable mask patterns 330A and 330B, which can be used to etch the underlying dual mask layer 320. The variable mask patterns 330A and 330B are consumed at a different rate while etching process to form structure mask patterns 320A-320B is performed. The etching of the dual mask layer 320 is conducted to expose the underlying feature layer 310 and to define structure mask patterns 320A-320B from the dual mask layer 320. Furthermore, in some embodiments according to the inventive concept, the variable mask pattern 330A-330B remaining on the structure mask patterns 320A-320B allow the etching thereof to be conducted at different rates due to the different widths of the mask patterns in regions A and B.

In particular, because the mask pattern in region A is narrower than the mask pattern in region B, a three-dimensional etching effect causes the variable mask pattern 330A in region A to be etched at a faster rate than the variable mask pattern 330B in region B. Remaining thickness of the variable mask pattern 330A in region A TA1 is lower than remaining thickness of the variable mask pattern 330B in region B TA2. Furthermore, in some embodiments according to the inventive concept, the greater the difference between WD1 and W3, the greater the difference between the respective thicknesses TA1 and TB1.

The three dimensional etching effect is illustrated by the arrows designating different directions a1, b1, c1 and a2, b2, and c2 shown in regions A and B respectively. In particular, the etching carried out along these different directions can be different due to the different thicknesses of the mask patterns in regions A and B. Accordingly, the different behavior of the etching in these different regions can contribute to the rate at which the variable mask pattern is etched while the structure mask patterns 320A and 320B are formed.

Figure 7:
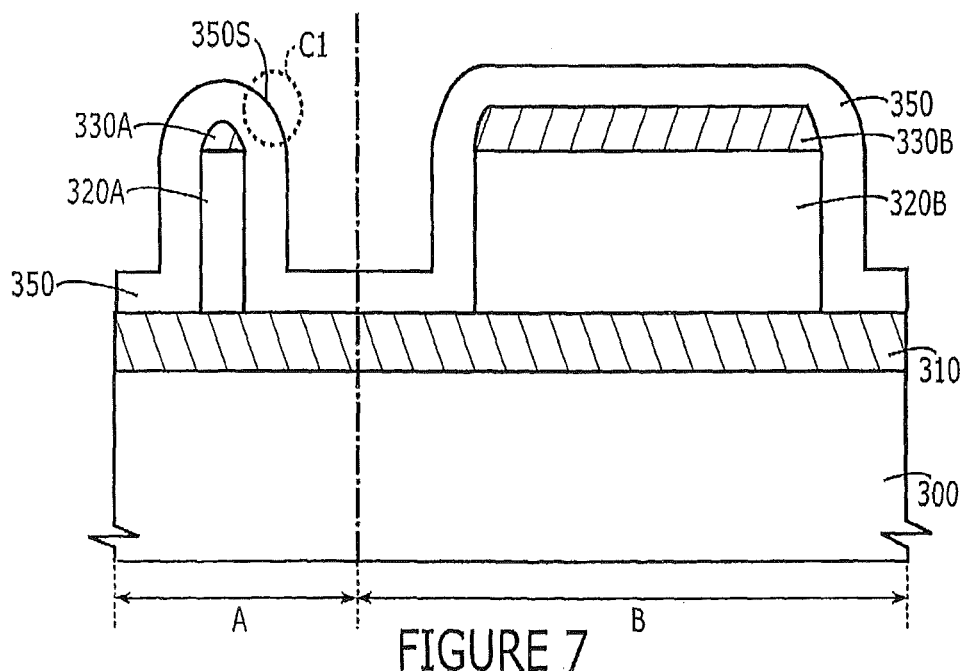

According to FIG. 7, a spacer layer 350 is conformally deposited on the structure mask patterns 320A and 320B including on the remnants of the variable mask patterns 330A and 330B found in regions A and B respectively. In some embodiments according to the inventive concept, the thickness of the spacer layer 350 may be about equal to the thickness of the structure mask pattern 320A shown in region A. In other embodiments according to the inventive concept, the thickness of the spacer layer 350 is greater than or less than the thickness of the structure pattern 320A. In still other embodiments according to the inventive concept, the variable mask pattern 330A is completely removed during the etching of the dual mask layer to form the structure pattern 320A. Accordingly, in such embodiments according to the inventive concept, the spacer layer 350 may directly contact the structure pattern 320A.

Figure 8:
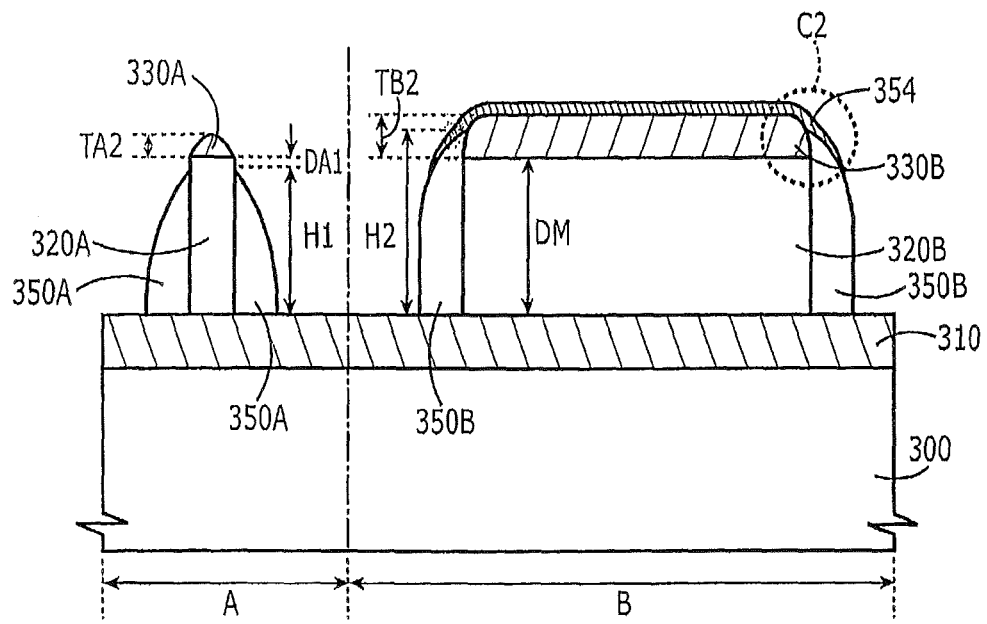

According to FIG. 8, a portion of the spacer layer 350 is removed from the feature layer 310 as well as from the variable mask patterns 330A and 330B. However, as shown in FIG. 8, a portion of the spacer layer remains on the structure mask patterns 320A and 320B and, particularly, on side walls thereof to provide opposing side wall spacers 350A and 350B on structure mask patterns 320A and 320B respectively.

As further shown in FIG. 8, the opposing side wall spacers 350B on structure pattern 320B fully covers side walls of the structure mask pattern 320B and extends above the structure mask pattern 320B to contact the portion of the variable mask pattern 330B thereon. In some embodiments according to the inventive concept, the spacer layer 350 is partially removed during an etch back process wherein etching rate in region A is greater than that in region B, which can be promoted by the portion C1 of the spacer layer 350 shown in FIG. 7. In particular, the slope of portion C1 can be relatively great so that the etching thereof can be accelerated relative to that found in region B. Accordingly, a portion of the side wall on the structure pattern 320A is exposed due to the accelerated etching rate in region A.

As shown in FIG. 8, the exposure of the side wall of the structure mask pattern 320A can be by about the distance DA1. Furthermore, the thickness TA2 of the remaining portion of the variable mask pattern 330A can be further reduced relative to the thickness TB2 of the variable mask pattern 330B due to the slope of the sidewall spacer layer portion C1 as described above in reference to FIG. 7. Furthermore, in some embodiments according to the inventive concept, because of the different etching rates in regions A and B, the height H1 of the opposing side wall spacers 350A can be less than the height H2 of the opposing side wall spacers 350B.

In some embodiments according to the inventive concept, during the etch back process of the spacer layer 350, polymer byproducts can be produced and deposited as layer 354 on the variable mask pattern 330B and on the opposing side wall spacers 350B. In other embodiments according to the inventive concept, the polymer byproduct layer 354 may be reduced or even eliminated based on the conditions associated with the etch back process. In some embodiments according to the inventive concept, the etch back process applied to the spacer layer 350 can be carried out using a main etching gas of $C_xF_y$, where x and y are integers 1 and 10 respectively. In other embodiments according to the inventive concept, the main etching gas can be $CH_xF_y$, where x and y are integers 1 and 10 respectively. In some embodiments according to the inventive concept, O2 and Ar may be added to the main etching gas. Accordingly, during the etch back process the polymer byproduct layer 354 may be affected by the amount of O2 included in the main etching gas or alternatively, can be affected by the temperature applied during the etch back process. In particular, the polymer byproduct layer 354 may be reduced or even eliminated by decreasing the amount of O2 or by lowering the process temperature.

Figure 9:
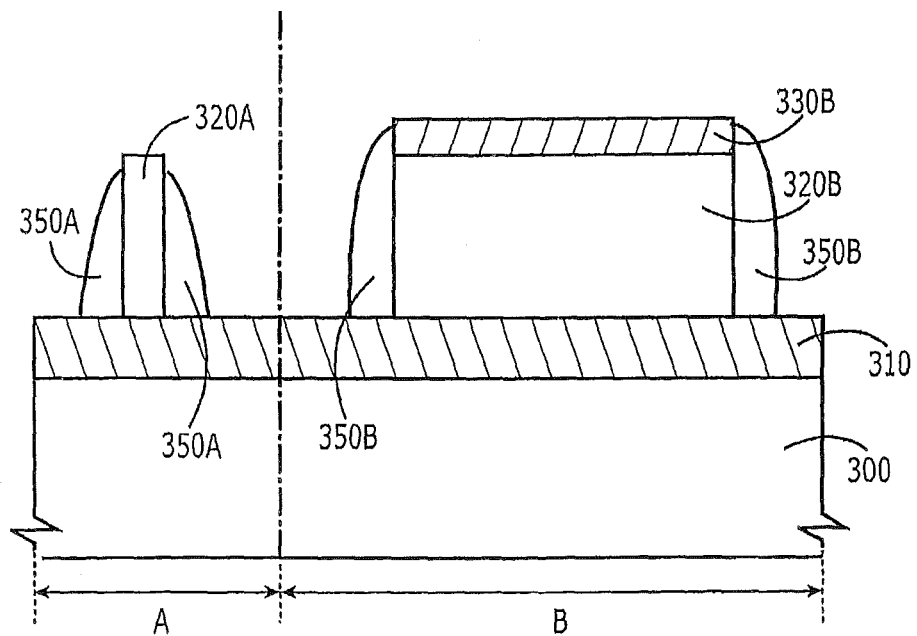

According to FIG. 9, the etch back process of the spacer layer 350 produces a plurality of self aligned reverse mask pattern defined by elements 320 and corresponding opposing side wall spacers 350 located thereon. Moreover, as shown in FIG. 9, a portion of the variable mask pattern 330A is removed from the narrow one of the structure mask patterns so that the narrow one of the self aligned reverse mask patterns is exposed on a top surface thereof. Furthermore, the variable mask pattern 330B remains on the wider one of the self aligned reverse mask pattern found in region B.

Figure 10:
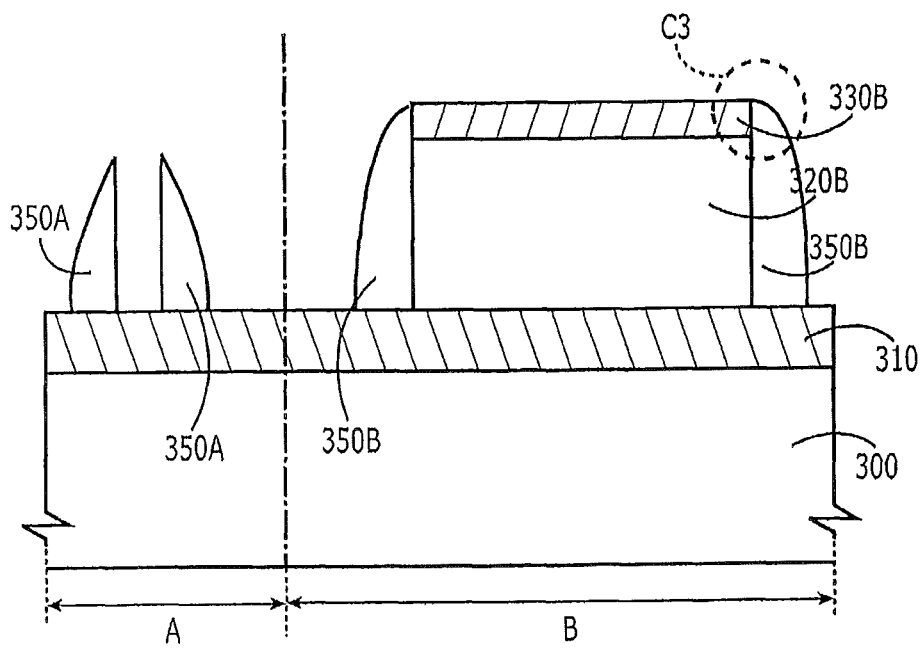

According to FIG. 10, the portion of the self aligned reverse mask pattern 320A in region A is removed from between the opposing side walls 350A so that the underlying portion of the feature layer 310 is exposed. Furthermore, the variable mask pattern included as part of the wider one of the self aligned reverse mask pattern found in region B remains despite the removal of element 320A. In particular, the variable mask pattern 330B as well as opposing side wall spacers 350B in region B protect the underlying structure 320B from the process used to remove the element 320A. Accordingly, a plurality of self aligned reverse mask patterns in both region A and region B are simultaneously formed wherein a plurality of self aligned reverse mask patterns in region A comprising spacers 350A and wherein a plurality of self aligned reverse mask patterns in region B comprising spacers 350B and structure mask patterns 320B.

Figure 11:
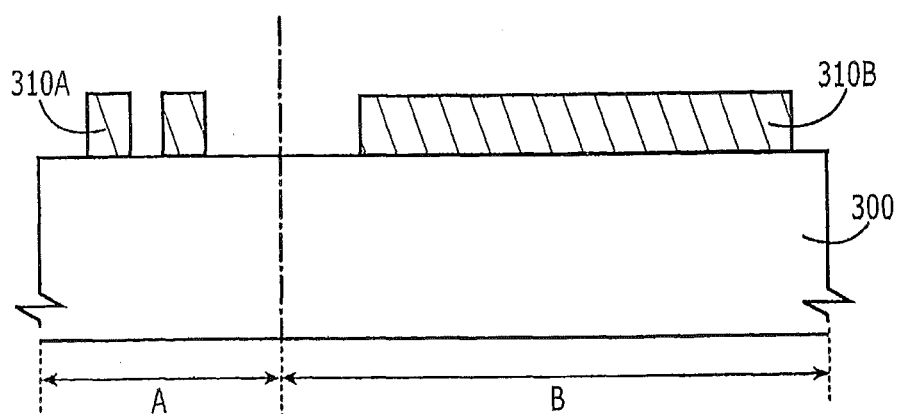

According to FIG. 11, the self aligned reverse mask patterns found in region A and region B are utilized as a mask to etch the underlying feature layer 310 to define features 310A in region A and 310B in region B. As described above, these features can be any component used in a semiconductor device such as conductive components found in gates and bit lines etc.

Figure 12:
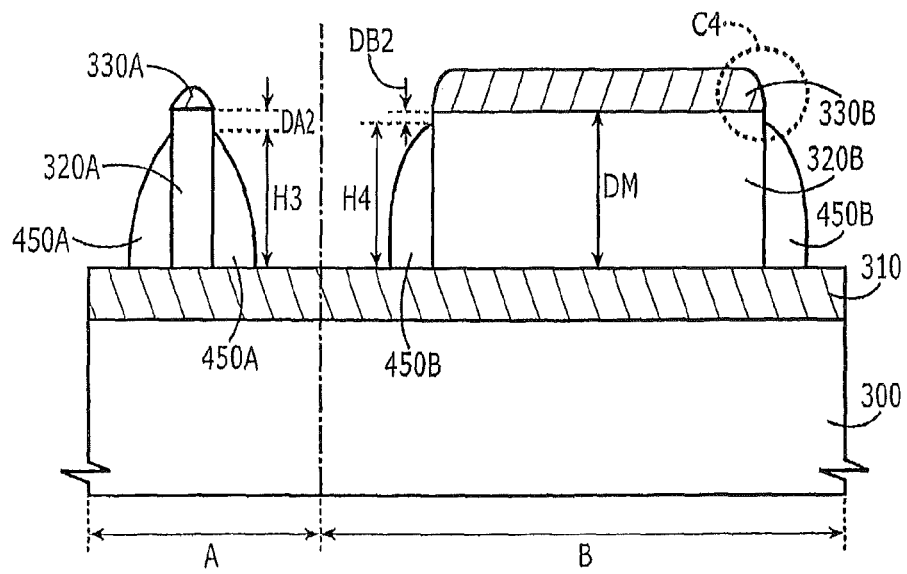
FIGS. 12-14 are cross sectional views that illustrate the simultaneous formation of a plurality of mask pattern using self aligned reverse patterning in some embodiments according to the inventive concept.
Figure 13:
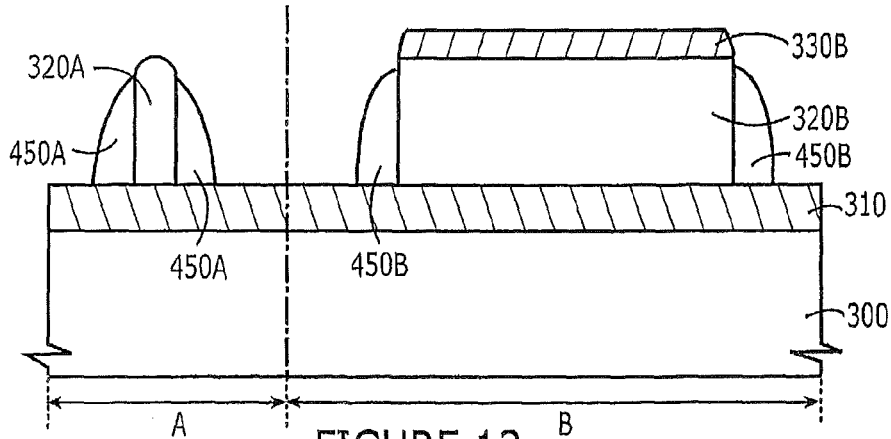
Figure 14:
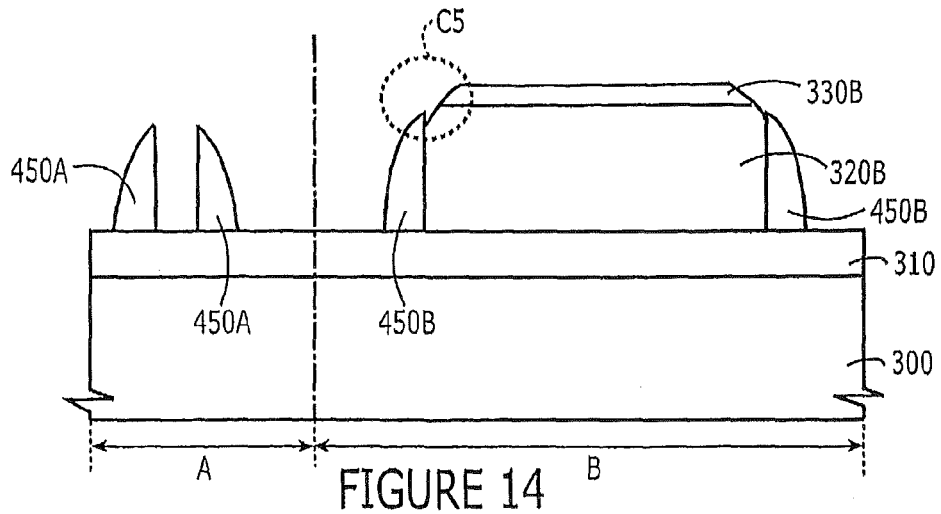

FIGS. 12-14 are cross sectional views that illustrate the simultaneous formation of a plurality of mask pattern using self aligned reverse patterning in some embodiments according to the inventive concept. According to FIG. 12, a spacer layer 450 is etched back to provide opposing side wall spacers 450A and 450B. Furthermore, as shown in FIG. 12, the opposing side wall spacers 450B located on the structure mask pattern located in region B are etched back to a height H4 above the feature layer 310 to expose a portion DB2 of a side wall of the structure 320B. It will be understood that a polymer byproduct layer (as illustrated above, for example in FIG. 8) is not shown in FIG. 12, however, a polymer byproduct layer may in fact be present in some embodiments according to the inventive concept.

According to FIG. 13, the variable mask pattern 330A and 330B are etched so that the portion of the variable mask pattern 330A located on the structure in region A is removed whereas the variable mask pattern 330B on the structure mask pattern in region B remains. In some embodiments, the complete removal of the variable mask layer on the structure in region A is attributed to the 3-D etching effect described above.

According to FIG. 14, the structure mask pattern in region A is removed by etching so that the opposing side wall spacers 450A remain on the feature layer 310 in region A. However, as also shown in FIG. 14, the structure mask pattern 320B located between the opposing side wall spacers 450B substantially remain beneath the variable mask pattern 330B in region B. It will be understood, however, that because of the exposed portion of the side walls of the structure 320B, a portion of the structure 320B may in fact be etched during the removal of the structure 320A as shown in highlighted portion C5.

Figure 15:
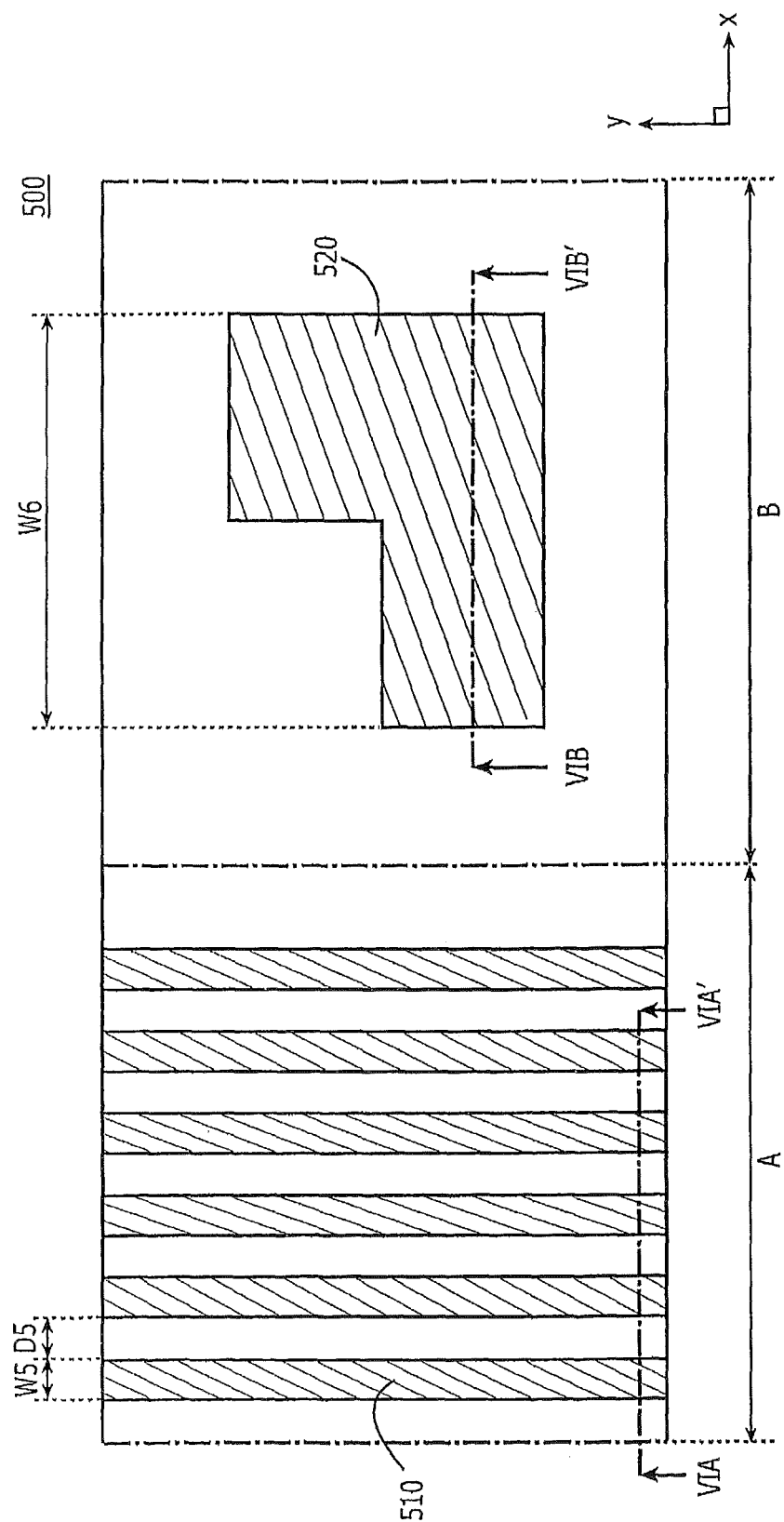
FIG. 15 is a plan view of the semiconductor device where elements shown in region A have a width W5 and they are separated by spacing D5 whereas the element in region B has a width W6 in some embodiments according to the inventive concept.
Figure 16:
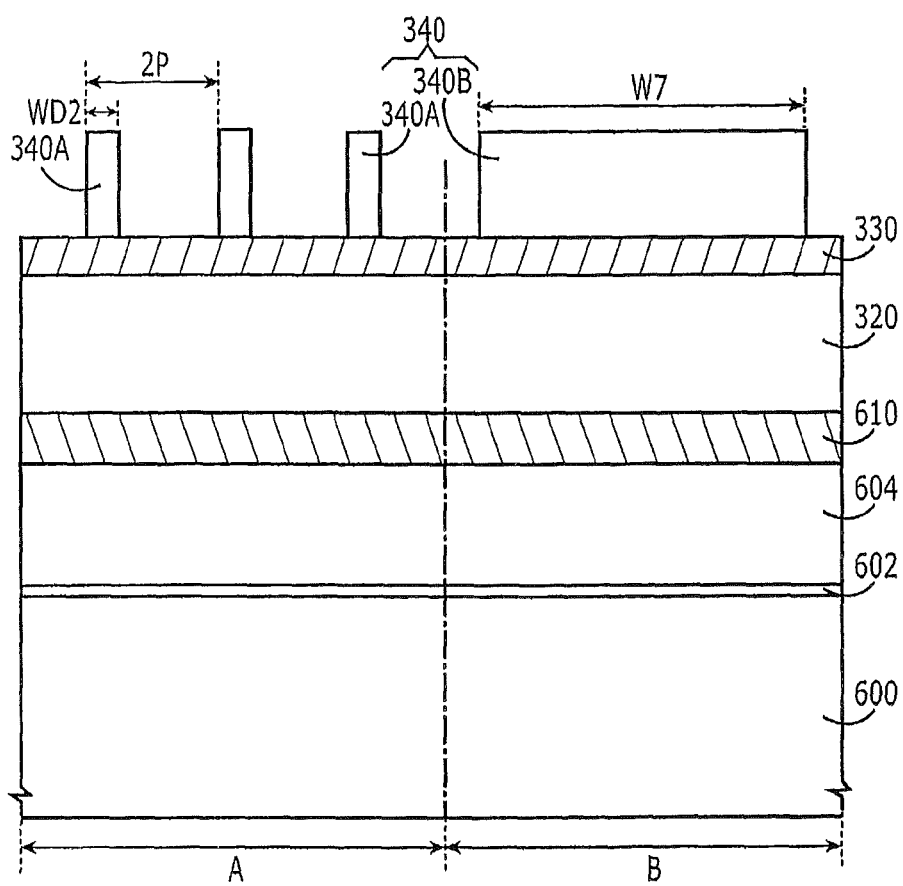
FIGS. 16-21 are cross sectional views that illustrate methods of forming STI regions in substrate by simultaneously forming a plurality of mask patterns used in self aligned reverse patterning in some embodiments according to the inventive concept.

Accordingly, the opposing spacers 450A in region A and the opposing spacers 450B and structure mask pattern 320B in region are formed simultaneously. FIG. 15 is a plan view of the semiconductor device 500 where elements 510 shown in region A have a width W5 and they are separated by spacing D5 whereas the element 520 in region B has a width W6 in some embodiments according to the inventive concept.

FIGS. 16-21 are cross sectional views that illustrate methods of forming STI (shallow trench isolation) regions in substrate by simultaneously forming a plurality of mask patterns used in self aligned reverse patterning in some embodiments according to the inventive concept. According to FIG. 16, a preliminary pattern including elements 340A and 340B collectively referred to as 340 is formed on a variable mask layer 330, which is formed on a dual mask layer 320 formed on a buffer mask layer 610 that is formed on a hard mask layer 604 on a pad oxide layer 602 all of which is located on the substrate 600.

It will be understood that the hard mask layer 604 can include a single layer that includes only one material or may include multiple layers comprising two or more material layers. In still further embodiments according to the inventive concept, the buffer mask layer 610 can have an etch selectivity relative to the hard mask layer 604. In some embodiments according to the inventive concept, the buffer mask layer 610 can be omitted.

Figure 17:
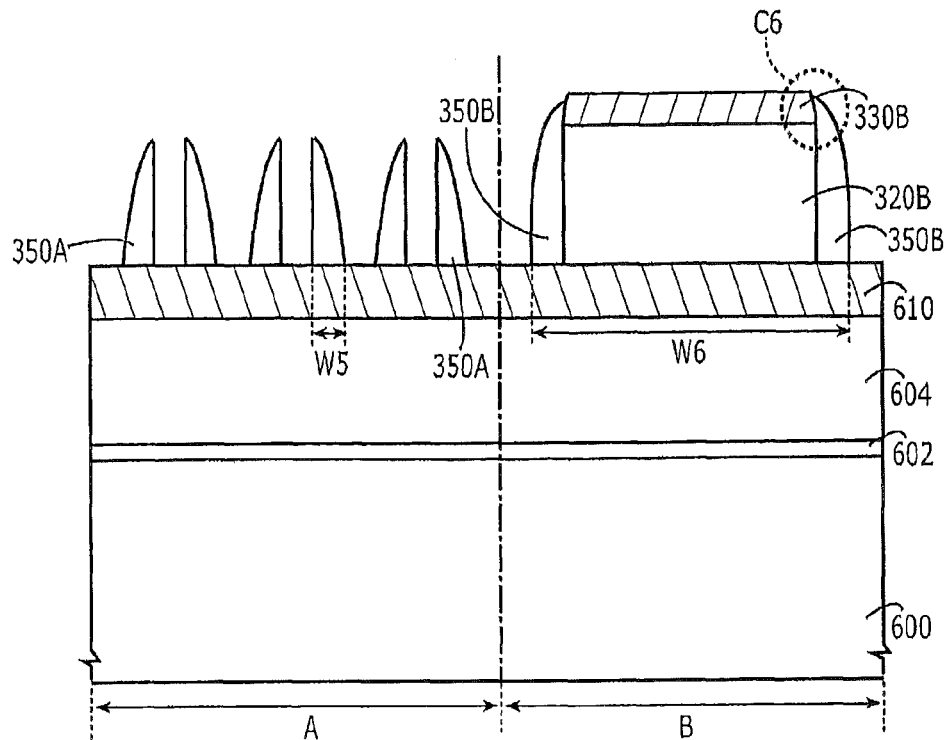

According to FIG. 17, mask patterns are formed on region A and region B including mask elements 350A and 350B and 320B respectively. In particular, the elements of the mask pattern in region A include side wall spacers 350A that can be formed as described above in reference to FIGS. 1-14. Still further, the mask pattern comprising opposing side wall spacers 350B and a structure mask pattern 320B and a variable mask layer 330B thereon is formed in the region B to have a different width (W6) all of which is located on the buffer mask layer 610. Still further, the opposing side wall spacers 350A shown in region A have a width W5 and are spaced apart by a distance W5. In other words, the spacing between pairs of opposing side wall spacers and the spacing between the opposing side wall spacers themselves is equal. As further shown in FIG. 17, a width of the element of the mask pattern in region B is shown to be W6.

Figure 18:
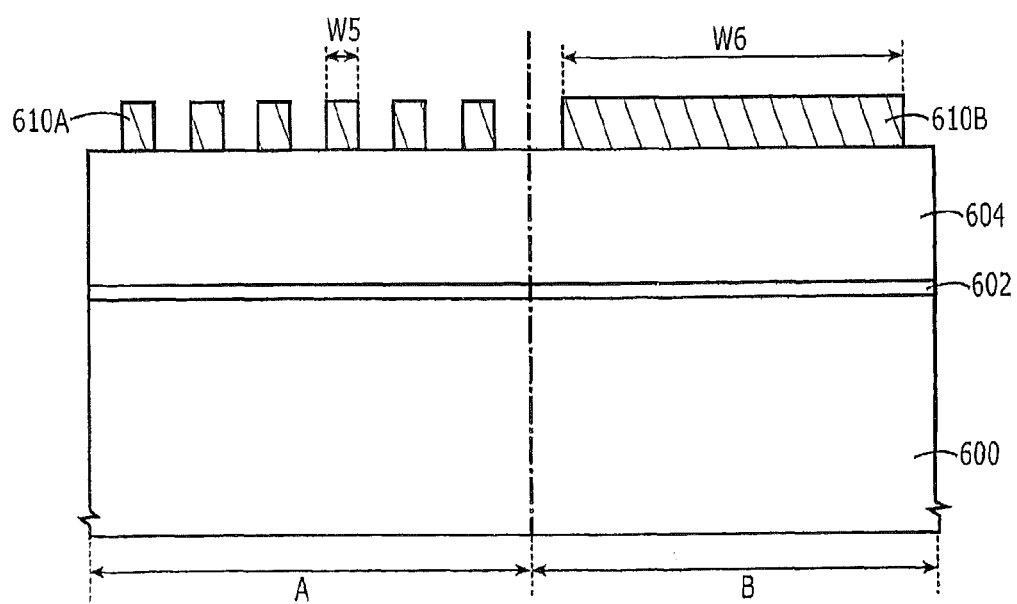

According to FIG. 18, the elements in the mask patterns in regions A and B are used as etch masks to form buffer mask patterns 610A and 610B in regions A and B respectively. According to FIG. 18, a width of the buffer mask pattern 610 formed in region A is W5 and the width of the buffer mask pattern 610B formed in region B is W6.

Figure 19:
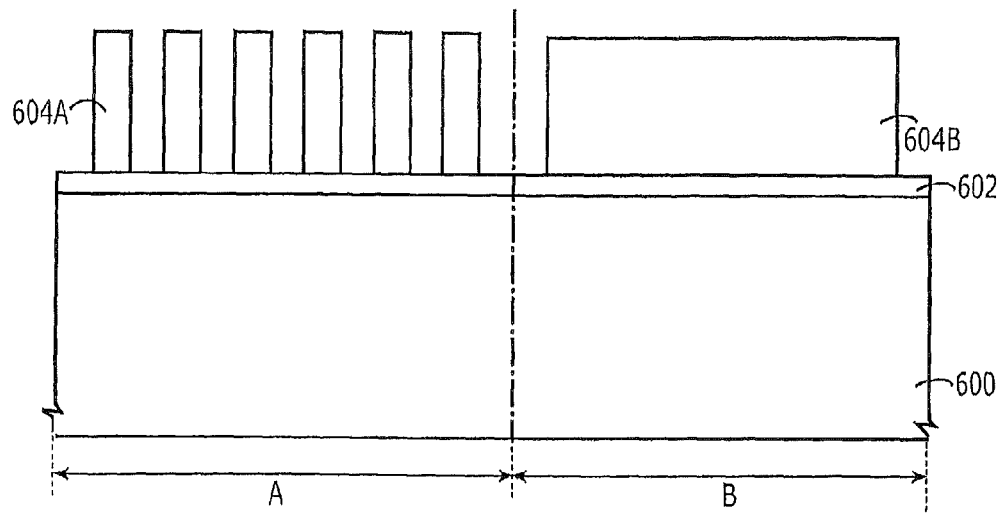

According to FIG. 19, the buffer mask pattern 610A and 610B are used to etch the hard mask layer 604 to provide a hard mask pattern 604A in region A and a hard mask pattern 604B in region B, beneath which portions of the pad oxide layer 602 are exposed.

Figure 20:
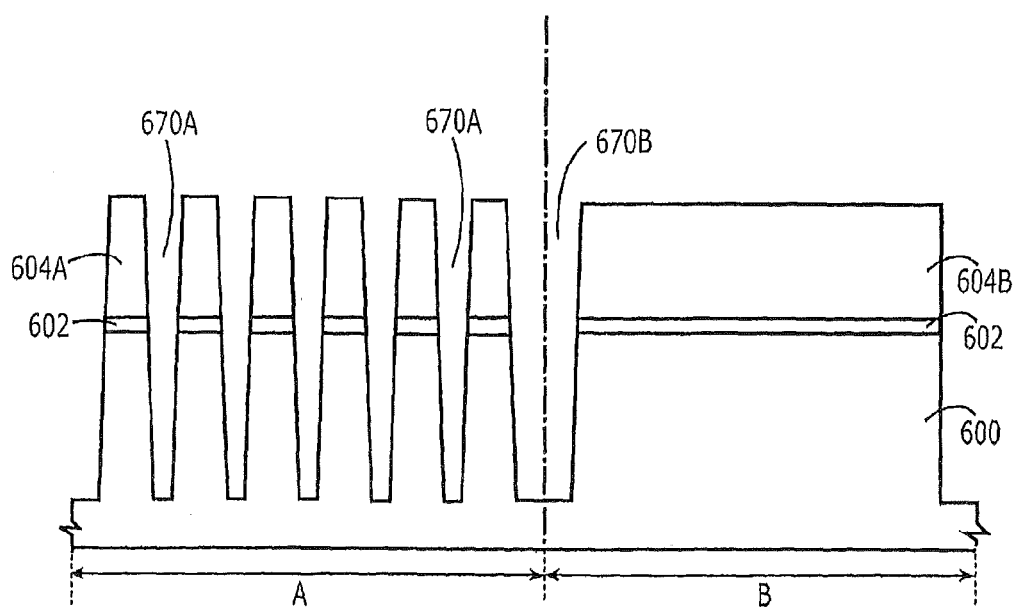

According to FIG. 20, the hard mask pattern 604A and 604B are used as an etch mask to etch through the exposed portions of the pad oxide layer 602 and into the substrate 600 to form trenches 670A in region A and 670B in region B.

Figure 21:
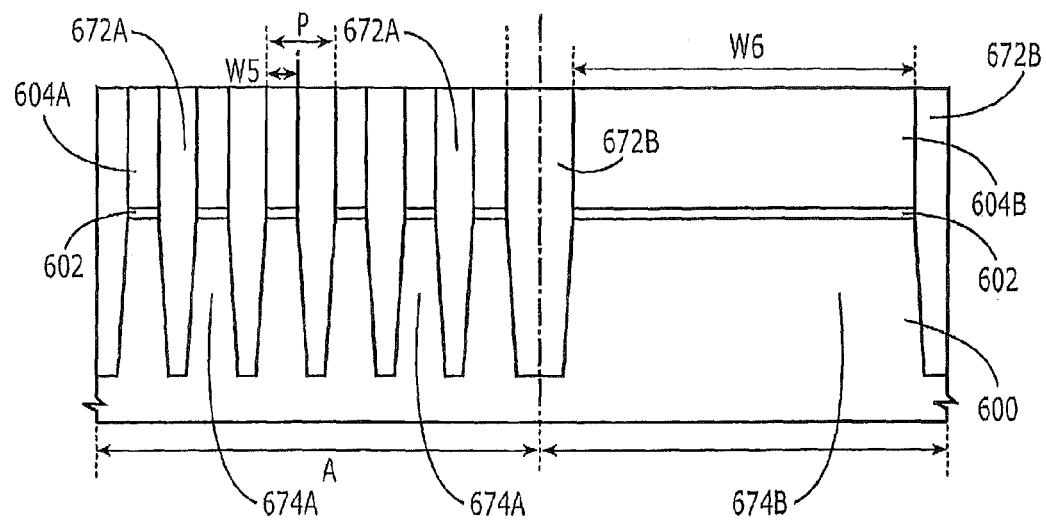

According to FIG. 21, an oxide material is formed in the trenches 670A and 670B to form STI regions 672A and 672B in regions A and B respectively. Furthermore, active regions 674A and 674B are defined between immediately adjacent shallow trench isolation regions 672A and 672B each of which can have the width W5 and W6 respectively as shown. Furthermore, the pitch between the adjacent act of areas can be P as shown.

Figure 22:
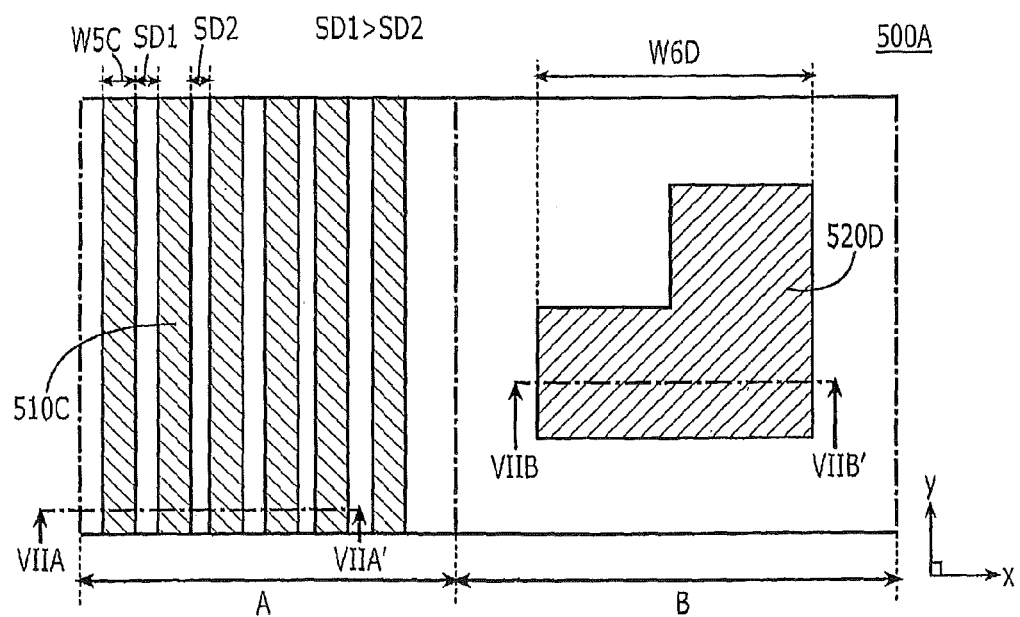
FIG. 22 is a plan view that illustrates a device having features formed therein by simultaneously forming a plurality of mask patterns using self aligned reverse patterning in some embodiments according to the inventive concept.

FIG. 22 is a plan view that illustrates a device having features formed therein by simultaneously forming a plurality of mask patterns using self aligned reverse patterning in some embodiments according to the inventive concept. In particular, FIG. 22 illustrates embodiments where the spacing between elements included in the pair thereof was greater than spacing between adjacent pairs of those elements. For example, as shown in FIG. 22, spacing SD1 shown separating one pair of features 510C is greater than a spacing SD2 separating that pair with the immediately adjacent pair features.

Figure 23:
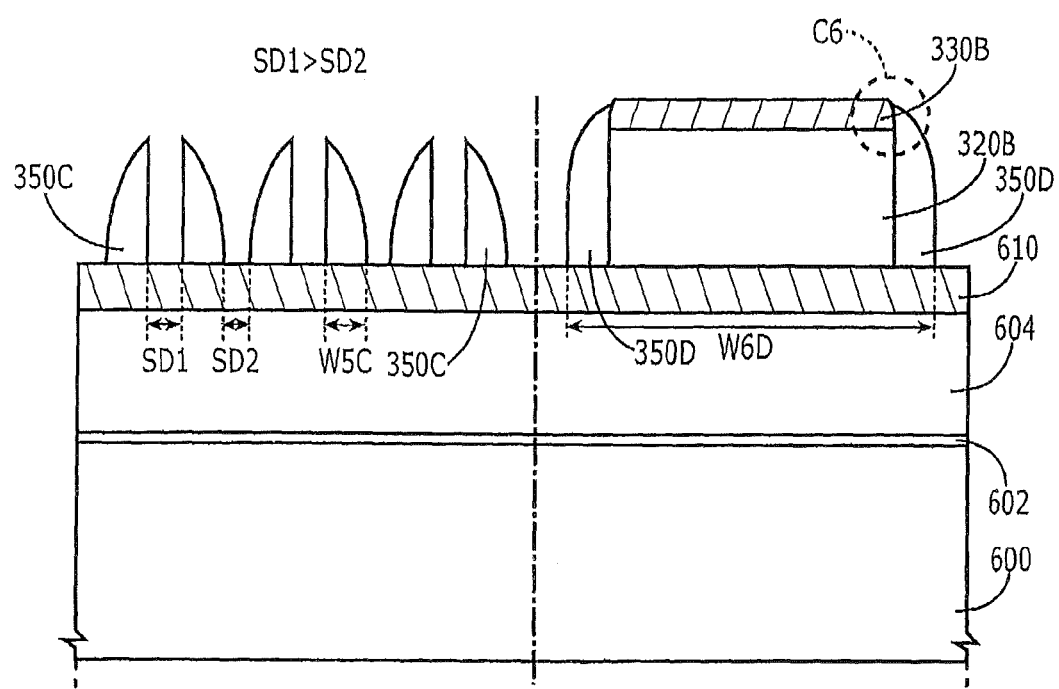
FIG. 23 is a cross sectional view illustrating the formation of mask pattern elements comprising opposing side wall spacers in region A and a mask pattern including elements sandwiched between opposing side wall spacers having a variable mask pattern formed thereon.
Figure 24:
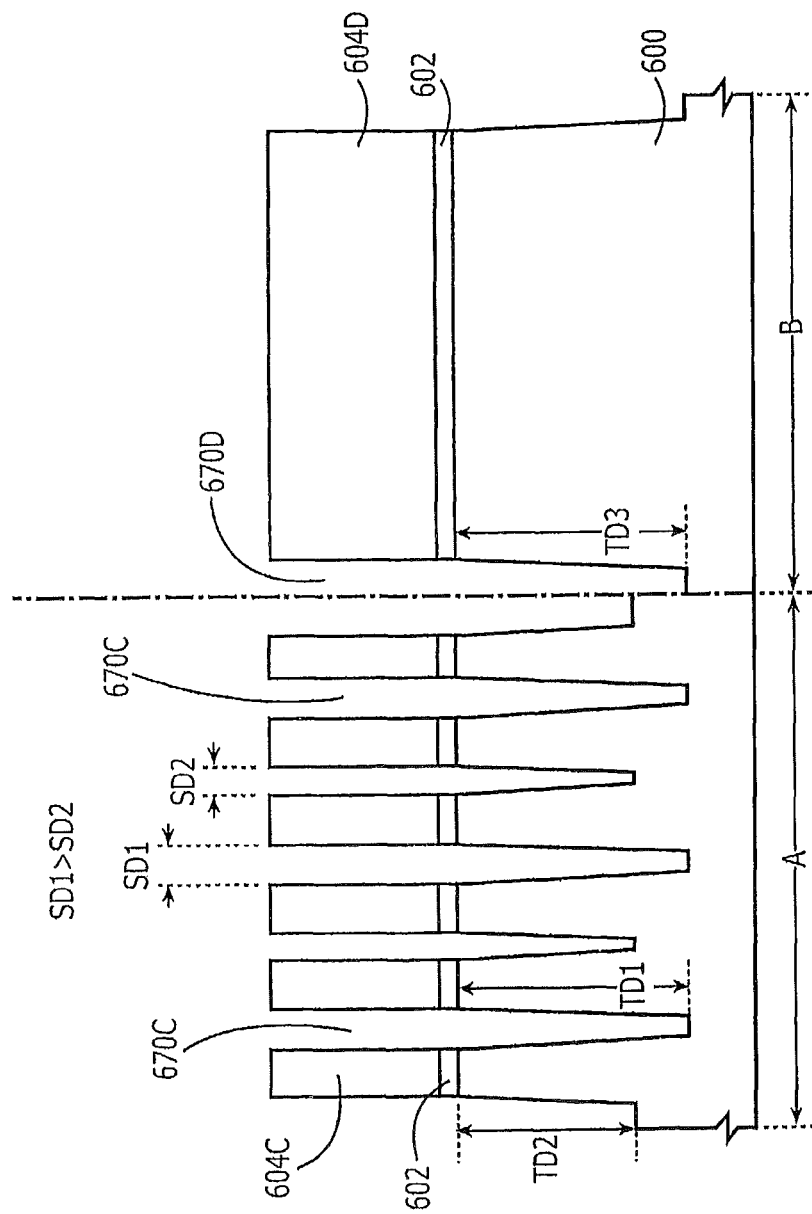
FIG. 24 is a cross sectional view illustrating the formation of STI regions in some embodiments according to the inventive concept.

FIG. 23 is a cross sectional view illustrating the formation of mask pattern elements comprising opposing side wall spacers 350C in region A and a mask pattern including elements 320B sandwiched between opposing side wall spacers 350D having a variable mask pattern 330B formed thereon. As described above in reference to FIG. 20, the trenches 670C are formed in the substrate by using the elements 350C and elements 320B and 320D in region B as an etching mask. Furthermore, in some embodiments according to the inventive concept, because of the different spacing between individual elements in a pair and the spacing between the pairs themselves, the trenches 670C can be formed to different depths. For example, as shown in FIG. 24, spacing SD1 associated with the spacing between an opposing pair of side wall spacers 350C shown in FIG. 23 provides the formation of a trench 670C to a depth TD1 beneath the pad oxide layer 602. In contrast, the trench 670C formed by the corresponding elements that are spaced together by distance SD2 (i.e., the spacing between opposing pair of side wall spacers 350C) provides for the formation of a trench to a depth TD2, which is less than TD1. It will be understood that, TD3 in the region B may depend on the distances from 604D to a neighboring pattern thereof.

Figure 25:
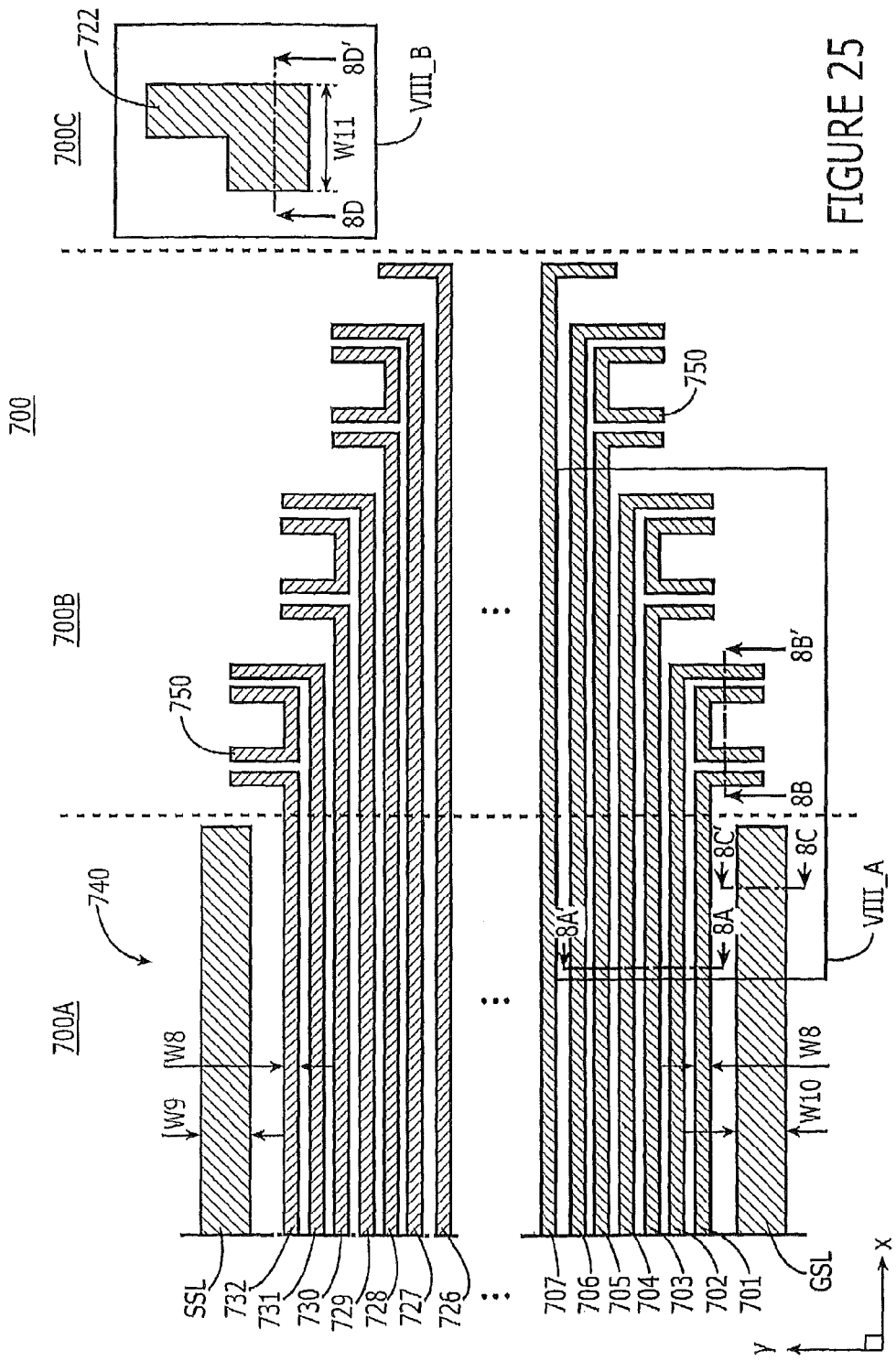
FIG. 25 is a plan view that illustrates a NAND flash device formed in some embodiments according to the inventive concept.
Figure 26:
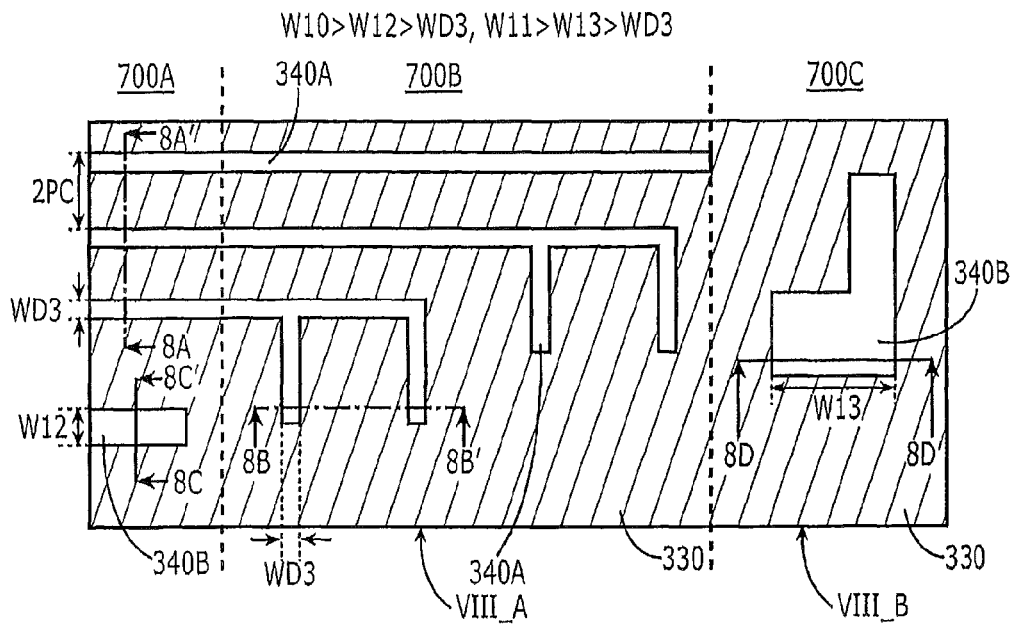
FIGS. 26-39 are alternating plan and cross sectional views that illustrate methods of simultaneously forming a plurality of mask patterns using self aligned reverse patterning in some embodiments according to the inventive concept.

FIG. 25 is a plan view that illustrates a NAND flash device formed in some embodiments according to the inventive concept. Furthermore, a highlighted portion 2500 includes various cross sectional views illustrated in subsequent figures in some embodiments according to the inventive concept. Still referring to FIG. 25, the NAND device 700 includes a cell array region 700A including NAND flash type cells. The region 700B corresponds to a contact region for the NAND flash device. The region 700C corresponds to a peripheral region of the flash type device. Further, the regions 740 corresponds to a cell block region wherein elements 701-732 correspond to a plurality of conductive lines. The regions 750 corresponds to dummy conductive lines such as word lines, bit lines or medal lines in some embodiments according to the inventive concept. Element 722 corresponds to conductive patterns for a peripheral circuit in some embodiments according to the inventive concept. Region 700B corresponds to a region used to connect conductive lines 701-732 to external circuits such as decoders in some embodiments according to the inventive concept.

FIGS. 26-39 are alternating plan and cross sectional views that illustrate methods of simultaneously forming a plurality of mask patterns using self aligned reverse patterning in some embodiments according to the inventive concept. In particular, element 800 corresponds to a substrate on which the flash memory devices can be formed, element 830 corresponds to conductive layer to which may be formed of materials TaN, TiN, W, N, HfN, WSi$_x$ or in combinations thereof. In some embodiments according to the inventive concept, the elements 830 can comprise bitlines and may be formed of polysilicon, metal, and/or metal alloys. Element 832 corresponds to a hard mask layer and may be either a single layer comprising one material or multiple layers each comprising separate material layers. Element 834 can comprise a buffer mask layer having enough selectivity relative to the hard mask layer 832. Element 320 corresponds to a dual mask layer, element 330 corresponds to a variable mask layer, and element 340 (340A and 340B) corresponds to a mask pattern in some embodiments according to the inventive concept.

Figure 27:
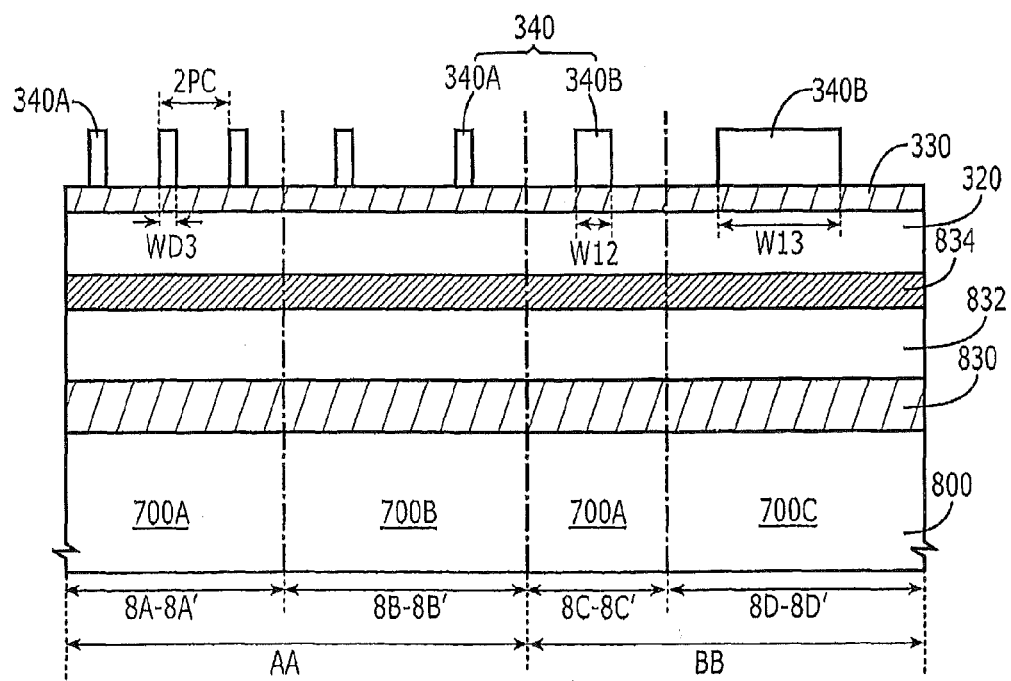

According to FIG. 27, a plurality of preliminary patterns are formed on the variable mask layer 330 having different spacings and widths. For example, the spacing between elements 340 in the preliminary pattern illustrated by cross section 8A-8A' can be 2PC with the width of WD3 whereas a width of the elements shown by cross section 8C-8C' is W12, and further, the width of element 340B shown according to cross section 8D-8D' is W13.

Figure 28:
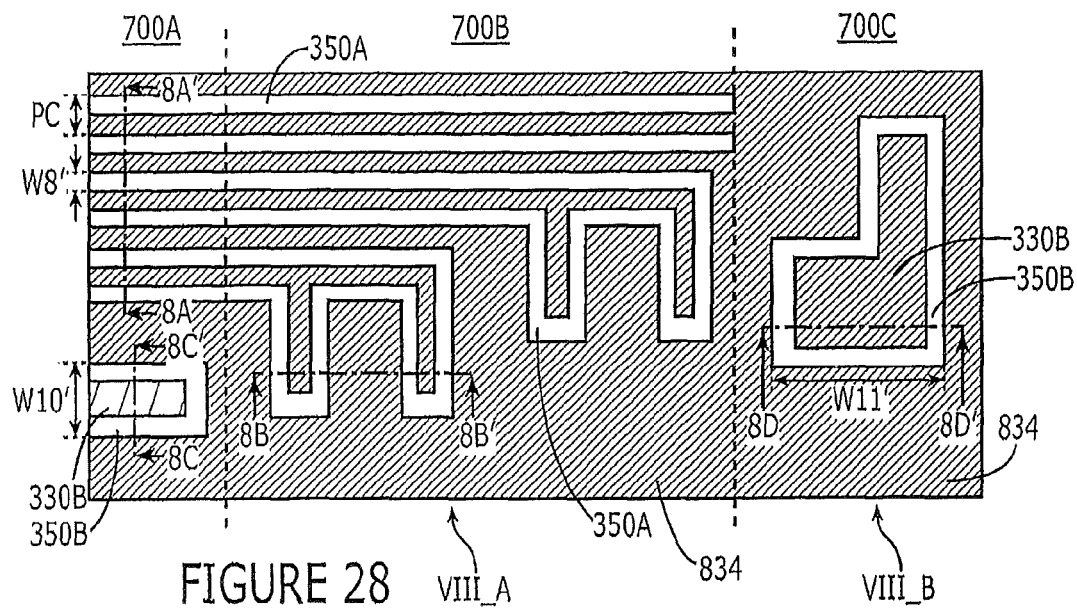
Figure 29:
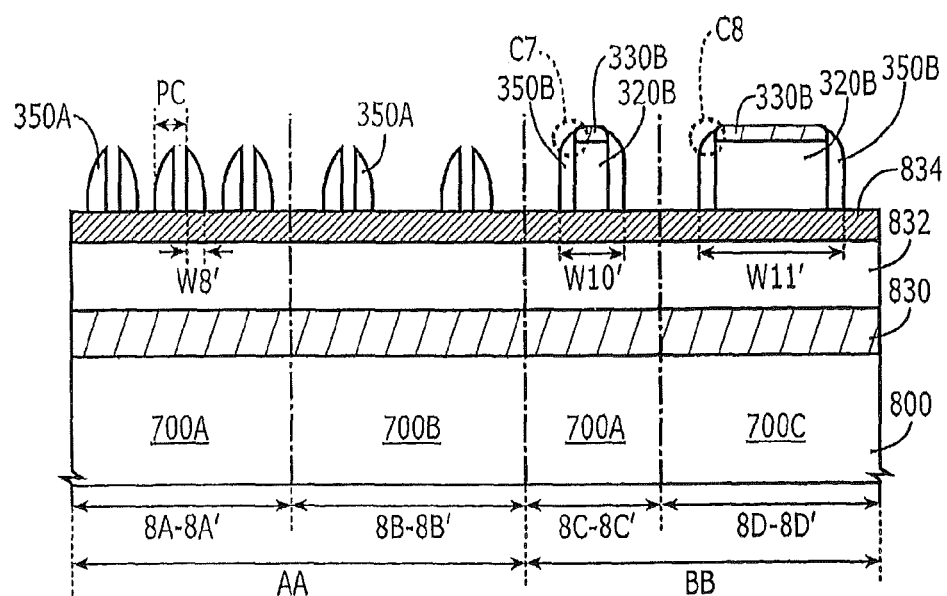

According to FIGS. 28 and 29, a plurality of mask patterns are formed in the different regions of the device using self aligned reverse patterning so that elements therein have different widths in some embodiments according to the inventive concept. In particular, opposing side wall spacers 350A and 350B are formed in different regions of the substrate where opposing side wall spacers 350A shown according to cross sections 8A-8A' and 8B-8B' have a different width than those shown according to cross sections 8C-8C' and 8D-8D'.

Figure 30:
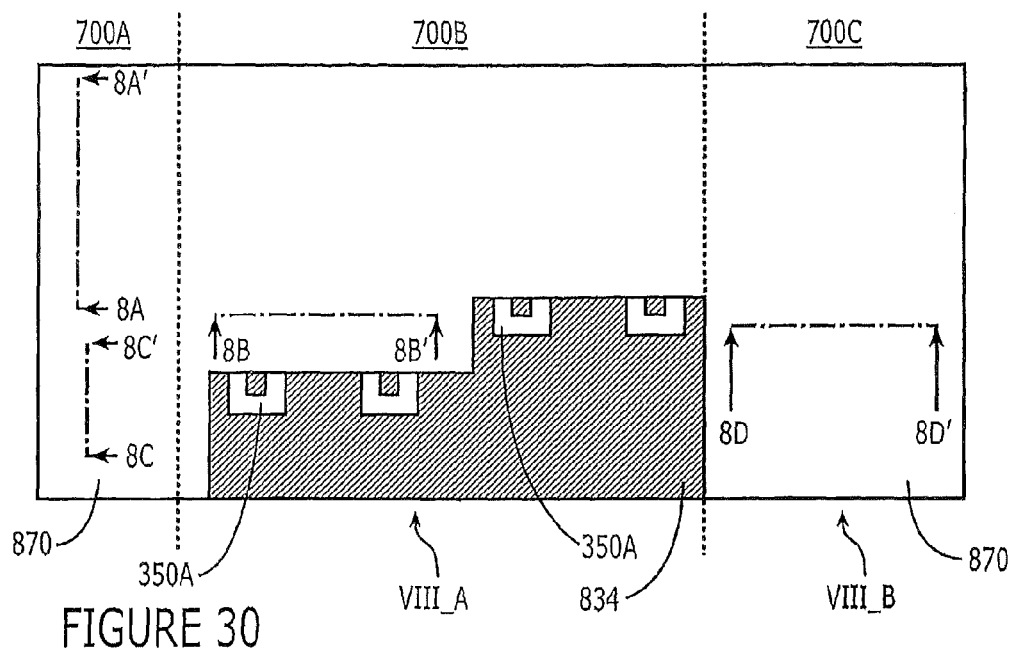
Figure 31:
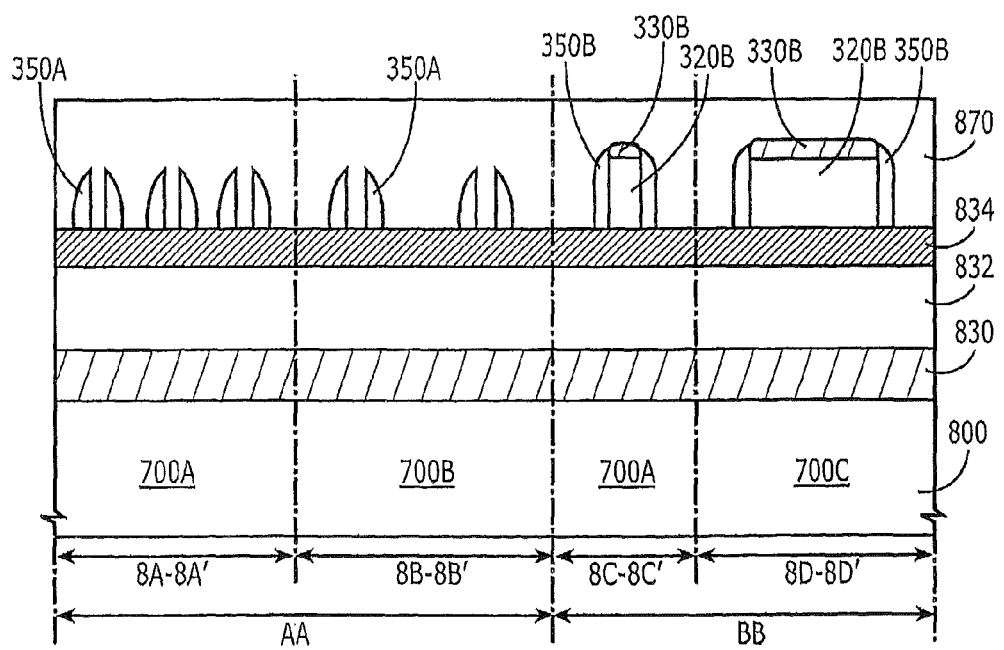

According to FIGS. 30 and 31 a separation mask pattern 870 is formed over the mask patterns and is patterned to partially expose, for example, the portions of the opposing side wall spacers 350A and formed looped-shaped spacers 350A. It will be understood that in some embodiments according to the inventive concept the separation mask pattern 870 can be a photoresist material.

Figure 32:
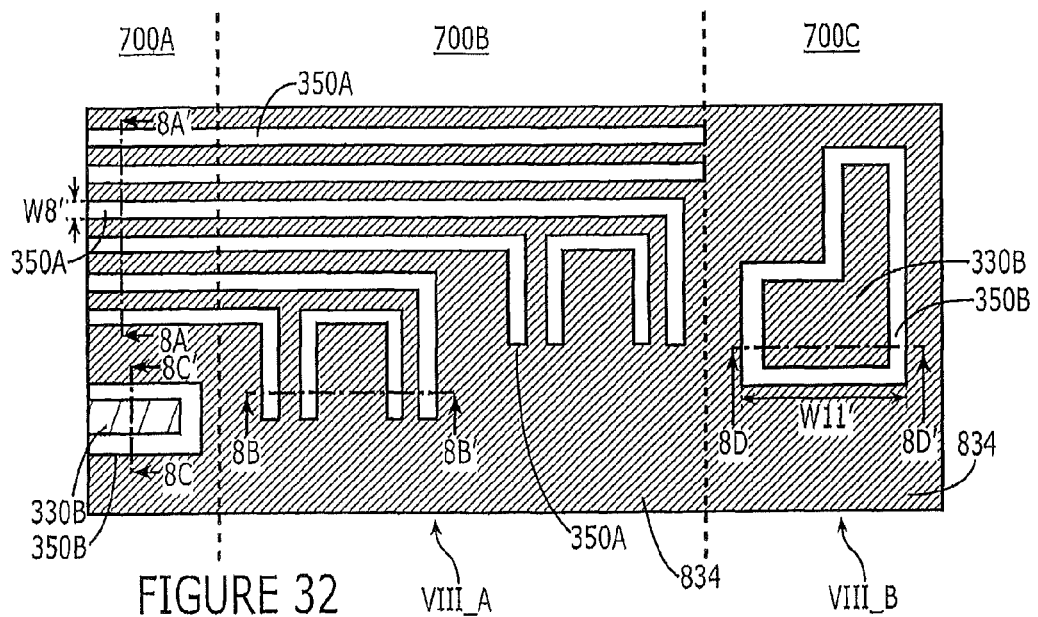
Figure 33:
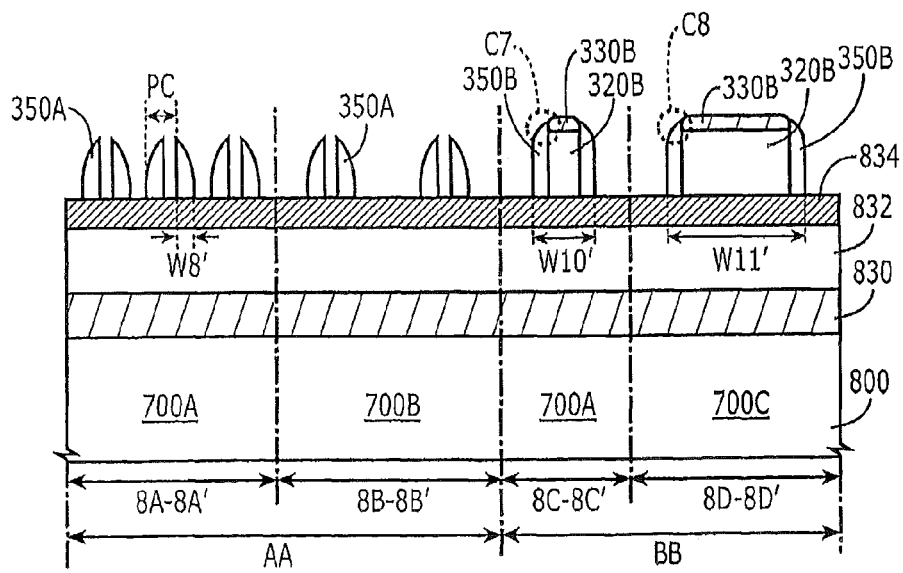
Figure 34:
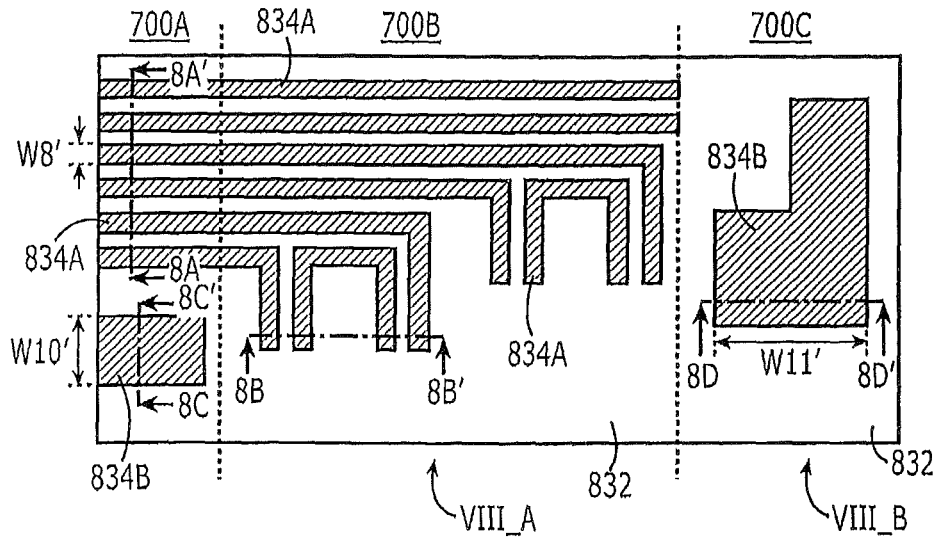
Figure 35:
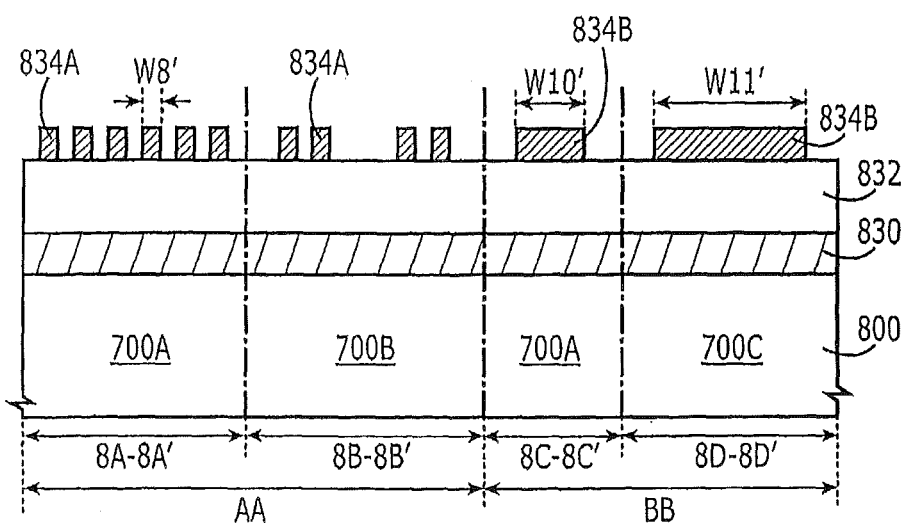

According to FIGS. 32 and 33, exposed portions of the side wall spacers 350A shown in FIG. 30 are removed (sometimes referred to as trimmed) to separate a portion of the looped-shaped spacers 350A from one another to define two separate spacers as shown in FIG. 32 for example. According to FIGS. 34 and 35, the elements 350A/350B/320B in the mask patterns are used to etch the underlying buffer mask layer 834 to define features 834A/834B as shown.

Figure 36:
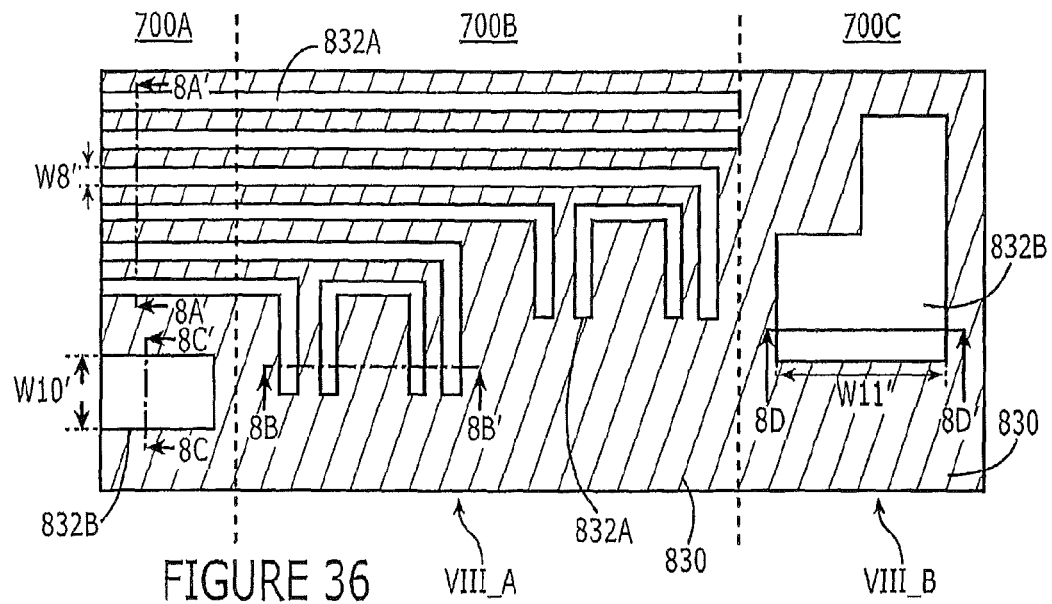
Figure 37:
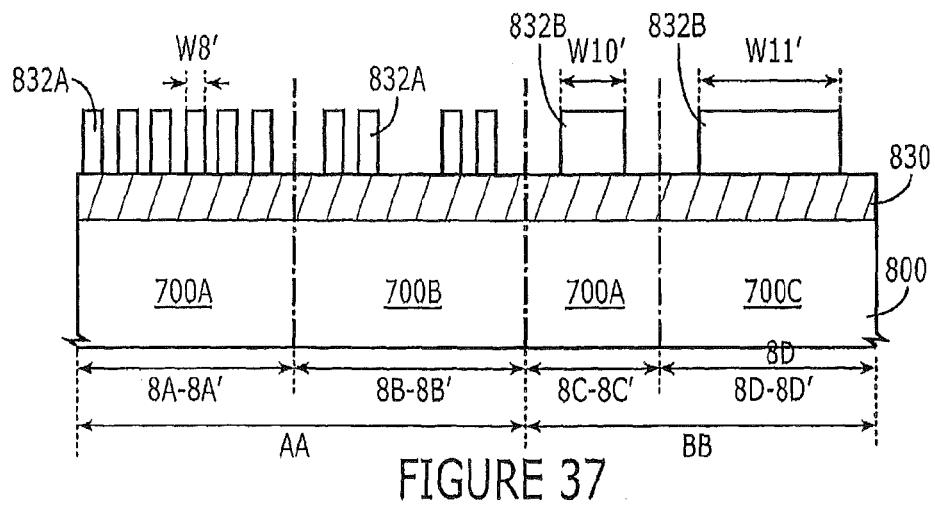
Figure 38:
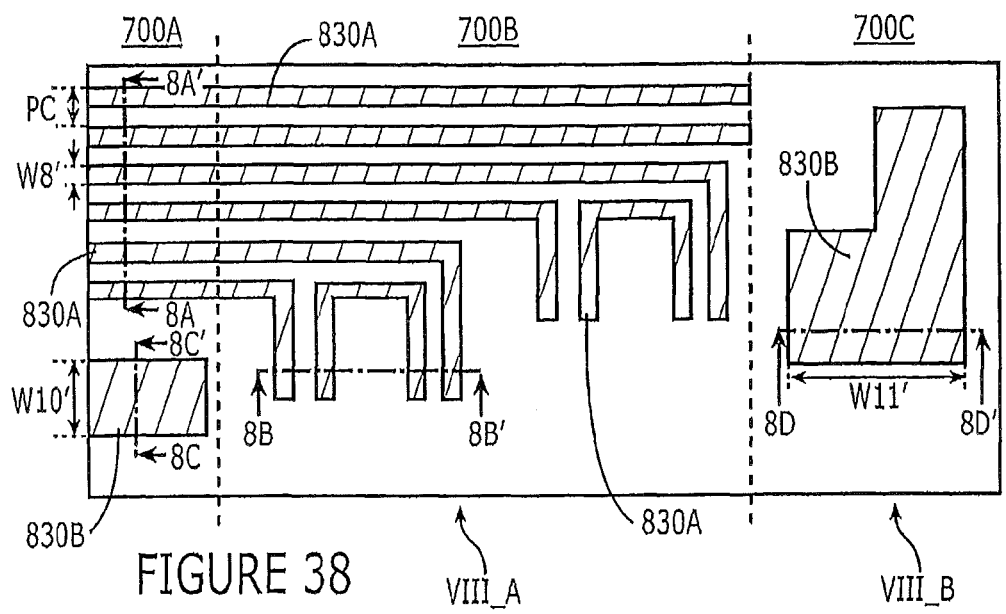
Figure 39:
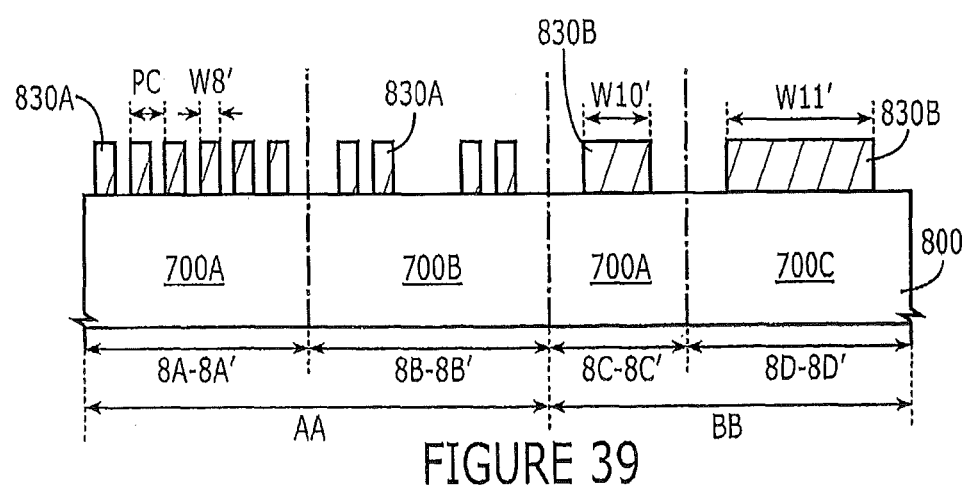

According to FIGS. 36 and 37, the features 834A/834B are used as a mask to form a reverse pattern 832A-832B on the conductive line layer 830. According to FIGS. 38 and 39, the conductive line layer 830 is etched using the reverse pattern 832A/832B to form conductive line patterns 830A/830B on the substrate 800.

Figure 40:
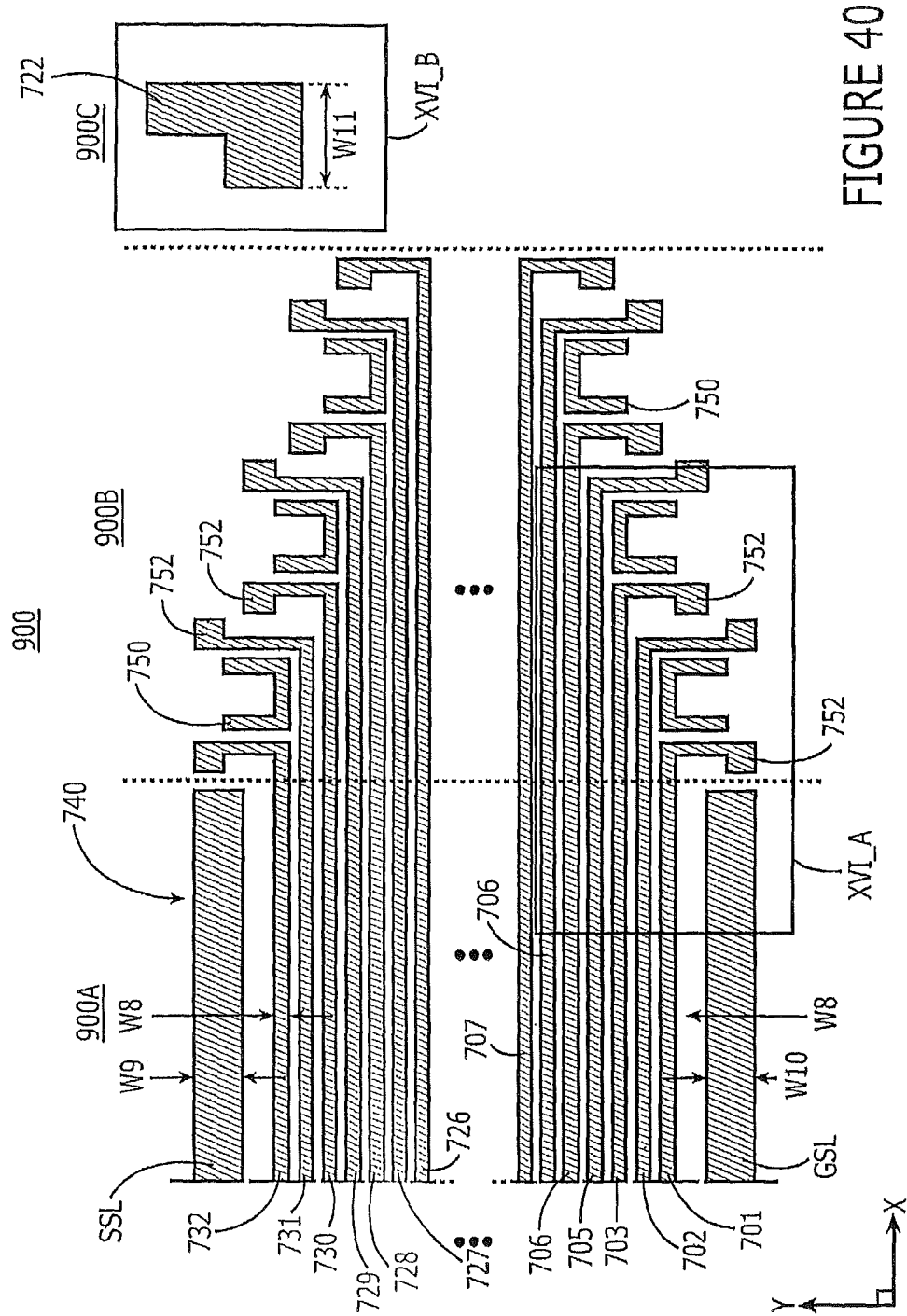
FIG. 40 is a plan view illustrates a semiconductor device including contact pads used to connect a plurality of conductive lines shown in FIG. 1-32 to external circuits such as decoders in some embodiments according to the inventive concept.
Figure 41:
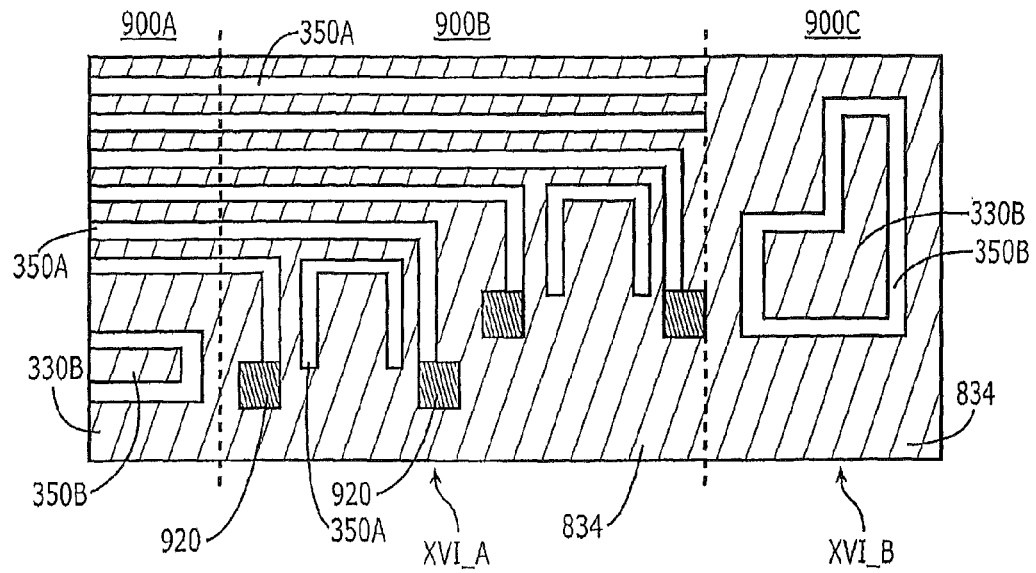
FIGS. 41-44 are plan views illustrating methods of simultaneously forming a plurality of mask patterns using self aligned reverse patterning in some embodiments according to the inventive concept.
Figure 42:
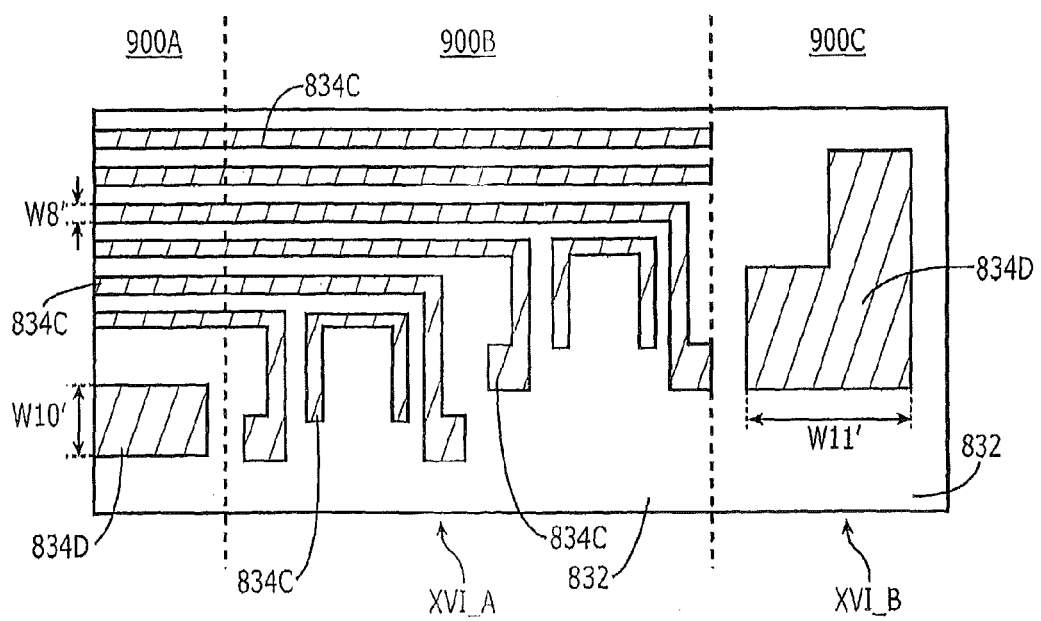
Figure 43:
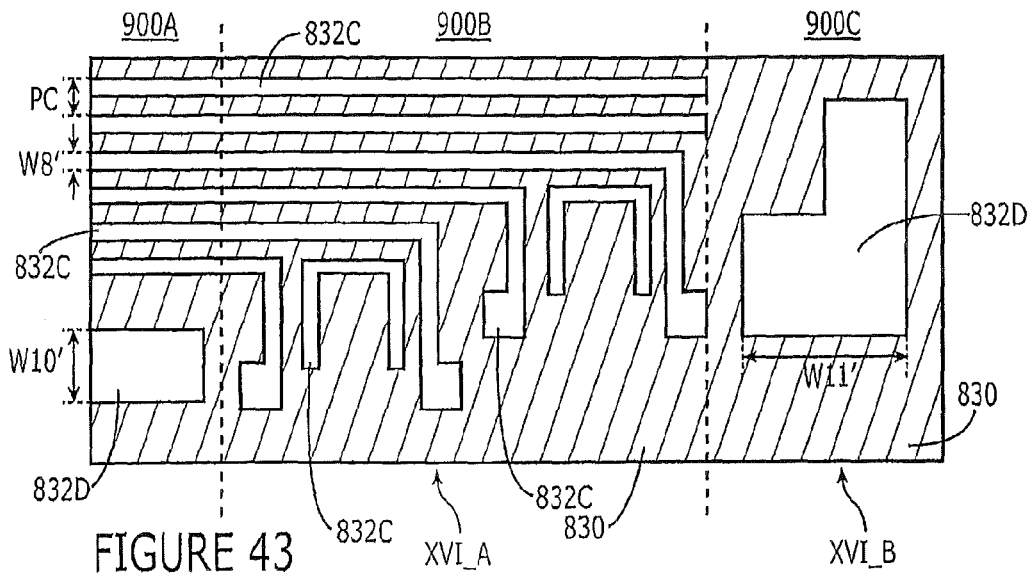
Figure 44:
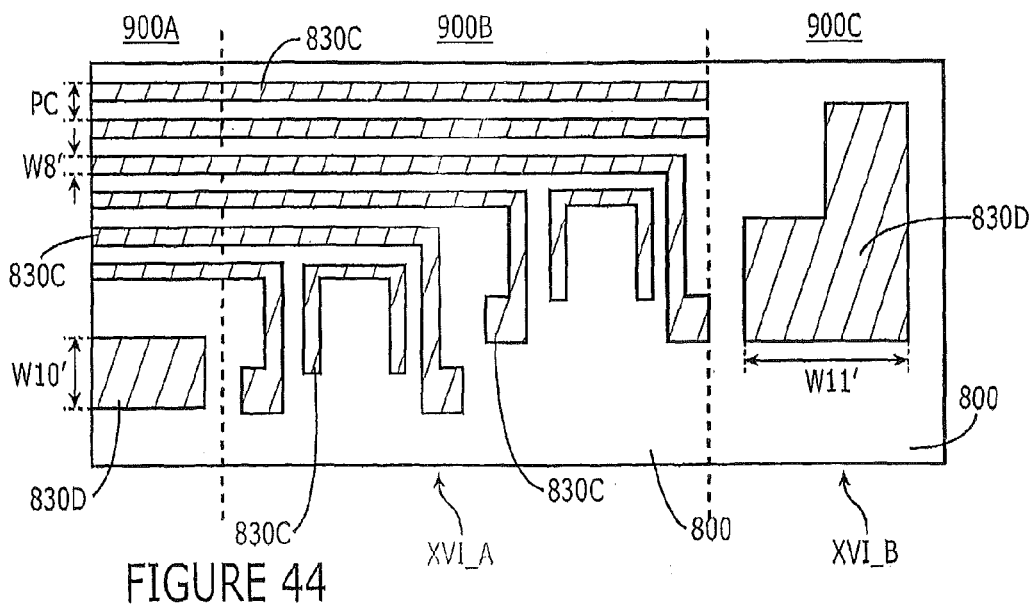

FIG. 40 is a plan view illustrates a semiconductor device 900 including contact pads 752 used to connect a plurality of conductive lines shown in 1-32 to external circuits such as decoders in some embodiments according to the inventive concept. According to FIGS. 41 and 42, a process such as that described above in reference to FIGS. 32 and 33 is carried out to provide the structure shown. Furthermore, a local mask pattern 920, such as a photoresist pattern is formed on the structures shown in FIGS. 32 and 33 and the buffer mask layer 834 is etched using elements 350A, 350B, 920 and 320B as an etch mask to form elements in 834C and 834D as shown. According to FIG. 43, element 832 is etched using 834C and 834D as an etch mask to form elements 832C and 832D as shown. According to FIG. 44, element 830 is etched using 832C and 832D as an etch mask to form 830C and 830D.

Figure 45:
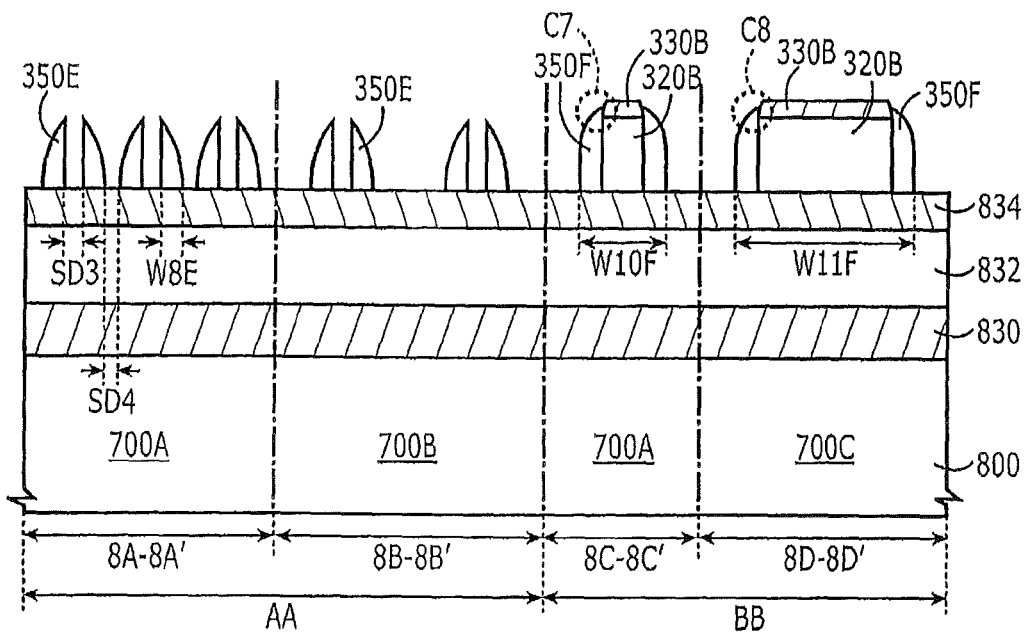
FIGS. 45-49 are cross-sectional views illustrating methods of simultaneously forming a plurality of mask patterns using self aligned reverse patterning in some embodiments according to the inventive concept.

According to FIG. 45, the structures shown therein are analogous to those described above in reference to FIG. 25 corresponding to cross sections 8A-8A', 8B-8B', 8C-8C', and 8D-8D' in some embodiments according to the inventive concept. According to FIG. 45, elements 350E and 350F (corresponding to the opposing side wall spacers providing elements of the mask patterns) are similar elements 350A and 350B shown in FIGS. 28 and 29. However, in contrast to the elements shown in FIGS. 28 and 29, the widths W8E corresponding to element 350E and W10F corresponding to element 350F are greater than the corresponding widths shown in FIGS. 28 and 29. Accordingly, the elements 350E in the mask patterns shown in FIG. 45 are spaced apart from one another such that elements within each pair of the opposing side wall spacers 350E are separated by first spacing immediately adjacent pairs of opposing side wall spacers 350E are separated by a different spacing SD4, which is less than SD3. In other embodiments according to the inventive concept, structures may be formed such that SD3 is less than SD4.

Figure 46:
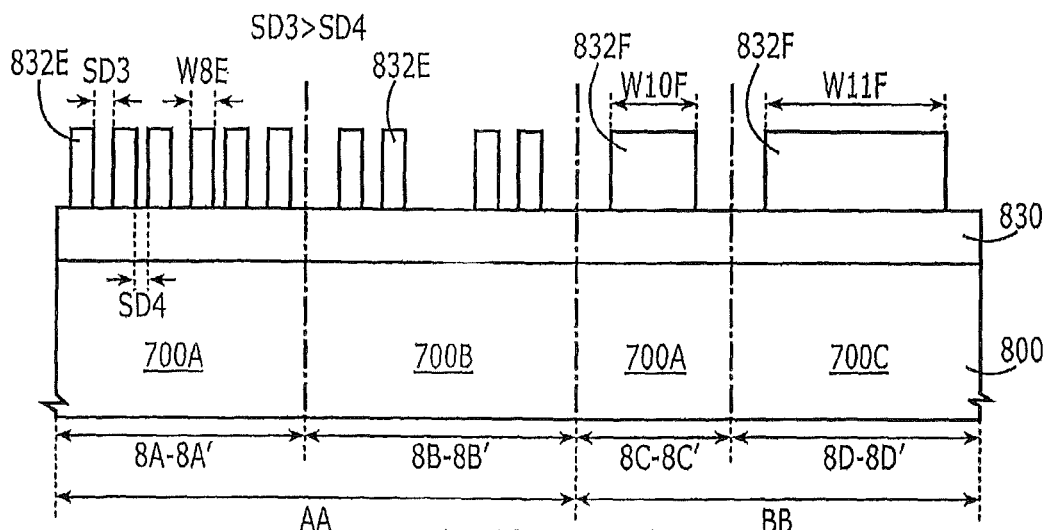
Figure 47:
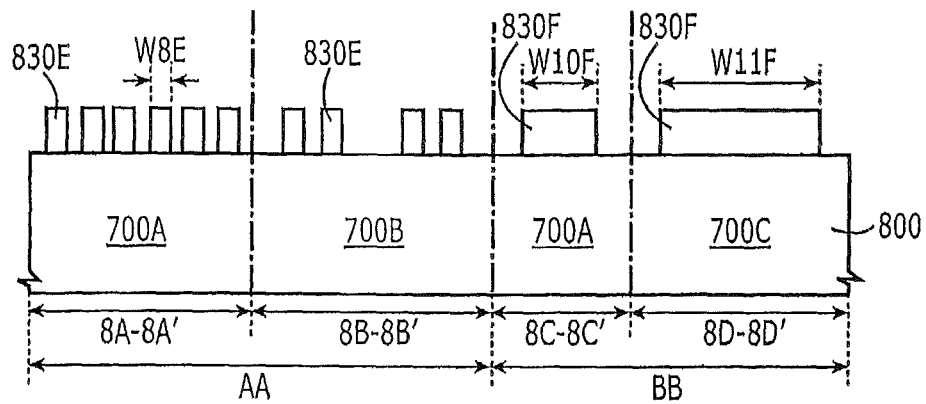

According to FIG. 46, elements 834 and 832 are etched in a manner analogous to that described above in reference to FIGS. 32-35 using elements 350E, 350F, and 320B as an etch mask to form elements 832E and 832F to provide a hard mask patterns 832E and 832F. According to FIG. 47, element 830 is etched using 832E and 832F as a mask to form element 830E.

Figure 48:
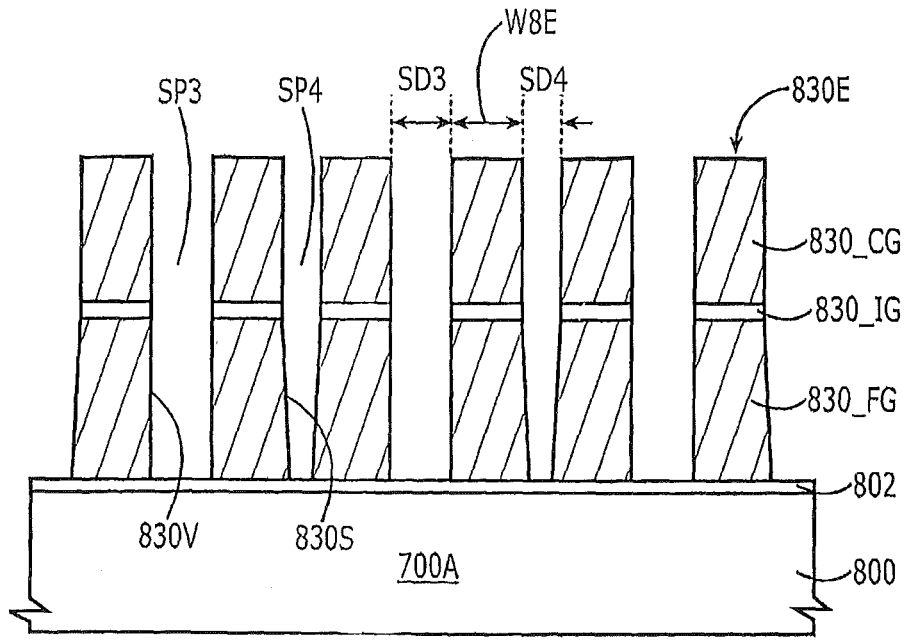

FIG. 48 is a cross sectional view of a NAND type flash memory device formed in some embodiments according to the inventive concept. According to FIG. 48, a floating type NAND flash memory device includes the plurality of conductive patterns 830E providing word lines for the NAND flash memory device. An element 802 provides a tunneling oxide layer, an element 830_FG can provide a floating gate structure, element 830_IG can provide an intricate dielectric layer. Further, and element 830_CG can provide a control gate. In some embodiments according to the inventive concept, the spacing between the elements in the conductive pattern can alternate according to different spacings SD3 and SD4. Furthermore, the profiles of side walls associated with these conductive patterns can be either slopped or substantially vertical.

Figure 49:
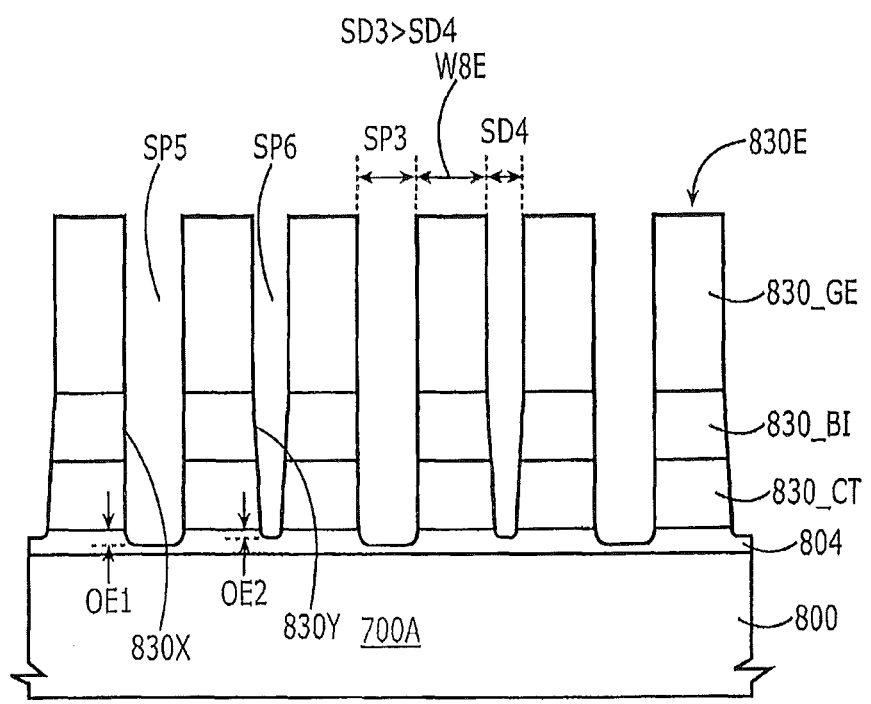

According to FIG. 21E, the charge trap floating type NAND device is shown in some embodiments according to the inventive concept. In particular, a plurality of conductive lines can be provided according to a pattern 830E to provide word lines to the NAND type flash memory device. Furthermore, element 804 can provide a tunneling oxide layer, and 830_CT can provide a charge trap layer. In some embodiments according to the inventive concept, the charge trap layer under 830_CT can be a high-K film such as Si3N4, a metal oxide, a metal nitride, or a combination thereof. A blocking insulation layer 830_BI can comprise a material, such as Al2O3, SiO2, HfO2, ZrO2, LaO, LaAlO, LaHfO and/or HfAlO. In element 830_GE can provide a gate electrode wherein the gate electrode material can comprise TaN, W, WN, HfN, WSix, or in combination thereof. As shown in FIG. 49, the spacing between the plurality of conductive patterns can vary. In particular, spacing between any of the adjacent conductive patterns can be provided as SD3 whereas other ones of the plurality of conductive patterns can be spaced apart by any amount of SD4, which is less than or greater than SD3. Still further, the vertical side wall profiles of the plurality of conductive patterns can be either vertical or slopped.

As described above, embodiments according to the inventive concept can provide for the simultaneous formation of a plurality of mask patterns using self aligned reverse patterning where the masks patterns include respective mask pattern elements that have different widths. For example, in some embodiments according to the inventive concept, elements having different widths and/or different spacing therebetween can be formed simultaneously on a feature layer, which is subsequently subject to etching using patterns having different size/space elements therein. Accordingly, the simultaneous formation of the mask patterns having the different sized elements therein can help to reduce the number of steps that may otherwise be employed during the process of forming the semiconductor device.

Still further, in some embodiments according to the inventive concept, one of the mask patterns can be formed by removing structures that have side wall spacers formed thereon in one area of the device, whereas a second area of the device includes a structure that is maintained between the sidewall spacers. Accordingly, maintaining the structure in the second area region of the chip while removing the structure in the first region can help to provide the elements having different sizes. In particular, in the first region described above, the elements in the corresponding mask can be defined as the side wall spacers themselves, which are left behind once the structure is removed. Furthermore, the element in the second region of the chip can include both the side wall spacers as well as the structure maintained therebetween. Accordingly, the different elements included in the different patterns in different regions of the chip can have different sizes.

What is claimed:

1. A memory device comprising:
    a first contact pad in a contact region of the memory device;
    a second contact pad in the contact region directly adjacent to the first contact pad, the first and second contact pads comprising a pair of contact pads for a memory block in the memory device;
    a first conductive line comprising a first long portion extending in a first direction and a first short portion extending in a second direction that is different than the first direction, the first short portion extending from the first contact pad to the first long portion, and the first long portion extending to the memory block in a cell array region of the memory device;
    a second conductive line, directly adjacent to the first conductive line, the second conductive line comprising a second long portion extending in the first direction and a second short portion extending in the second direction, the second short portion extending from the second contact pad to the second long portion, and the second long portion extending to the memory block; and
    a dummy conductive pattern between the first and second short portions in the contact region.

2. The memory device of claim 1 wherein the dummy conductive pattern extends between the first and second short portions toward ends of the first and second contact pads, the first and second short portions ending short of the ends of the first and second contact pads.

3. The memory device of claim 2 wherein the dummy conductive pattern includes an opening to define a U shaped dummy conductive pattern wherein the opening faces towards the ends of the first and second contact pads.

4. The memory device of claim 2 wherein the end of the first contact pad and the end of the second contact pad are aligned to one another in the first direction so that one end does not extend beyond the other in the second direction.

5. The memory device of claim 3 wherein the dummy conductive pattern further comprises:
    a first portion of the dummy conductive pattern extending alongside the first short portion of the first conductive line for a first length toward the first contact pad to an end point of the first portion that is short of the end of the first contact pad; and
    a second portion of the dummy conductive pattern, spaced apart from the first portion of the dummy conductive pattern, the second portion extending alongside the second short portion of the second conductive line for the first length toward the second contact pad to an end point of the second portion that is short of the end of the second contact pad.

6. The memory device of claim 5 wherein the first and second contact pads are wider than both of the first and second portions of the dummy conductive patterns in the first direction.

7. The memory device of claim 6 wherein the first and second contact pads are wider than the first and second short portions, respectively, in the first direction.

8. The memory device of claim 1 wherein the first conductive line comprises a first L shaped conductive line and wherein the second conductive line comprises a second L shaped conductive line.

9. The memory device of claim 1 further comprising:
    a ground select line including a first bar shaped portion extending in the first direction; and a string select line including a second bar shaped portion extending in the first direction, wherein the first and second long portions extend between the first and second bar shaped portions.

10. A NAND Flash memory device comprising:
first and second directly adjacent contact pads defining a first pair of contact pads in a contact region of the NAND Flash memory device, the first pair of contact pads electrically coupled to a first memory cell block in the NAND Flash memory device;
third and fourth directly adjacent contact pads defining a second pair of contact pads in the contact region of the NAND Flash memory device, the second pair of contact pads electrically coupled to a second memory cell block that is directly adjacent to the first memory cell block;
a first U shaped dummy conductive line including a first opening that faces a space between the first pair of contact pads; and
a second U shaped dummy conductive line including a second opening that faces away from the first opening and towards a space between the second pair of contact pads.

11. The NAND Flash memory device of claim 10, the device further comprising:
a first L shaped conductive line coupling the first contact pad to the first memory cell block;
a second L shaped conductive line coupling the second contact pad to the first memory cell block, the second L shaped conductive line following a profile of the first L shaped conductive line;
a third L shaped conductive line coupling the third contact pad to the second memory cell block; and
a fourth L shaped conductive line coupling the fourth contact pad to the second memory cell block, the fourth L shaped conductive line following a profile of the third L shaped conductive line.

12. The NAND Flash memory device of claim 11, wherein the first and third L shaped conductive lines are mirror image L shapes of each other relative to an axis extending in a direction toward the first and second memory blocks alongside the first through fourth L shaped conductive lines.

13. The NAND Flash memory device of claim 11 further comprising:
a ground select line including a first bar shaped portion; and
a string select line including a second bar shaped portion, wherein the first-fourth L shaped conductive lines are located between the first and second bar shaped portions.

14. The NAND Flash memory device of claim 10 wherein the first U shaped dummy conductive line extends toward ends of the first and second contact pads and ends short of the ends of the first and second contact pads.

15. The NAND Flash memory device of claim 14 wherein the end of the first contact pad and the end of the second contact pad are aligned to one another.

16. The NAND Flash memory device of claim 11 wherein the first and second contact pads are wider than a portion of the first U shaped dummy conductive line that extends parallel to the first and second contact pads; and
wherein the third and fourth contact pads are wider than a portion of the second U shaped dummy conductive line that extends parallel to the third and fourth contact pads.

17. The NAND Flash memory device of claim 11 wherein the first and second contact pads each have a shape that is a mirror image of the other relative to an axis extending between the first and second contact pads; and
the third and fourth contact pads each have a shape that is a mirror image of the other relative to the axis extending between the third and fourth contact pads.

18. The NAND Flash memory device of claim 10 further comprising:
a plurality of first U shaped dummy conductive lines including the first U shaped dummy conductive line; and
a plurality of second U shaped dummy conductive lines including the second U shaped dummy conductive line, ones of the pluralities of the first and second U shaped dummy conductive lines are decreasingly spaced apart from one another as a distance to the first and second memory blocks increases.

19. A NAND Flash memory device comprising:
a first contact pad in a contact region of the NAND Flash memory device;
a second contact pad in the contact region directly adjacent to the first contact pad, the first and second contact pads comprising a pair of contact pads for a memory block in the NAND Flash memory device;
a first non-linear shaped conductive line electrically coupled to the first contact pad, the first non-linear shaped conductive line extending from the first contact pad to the memory block in a cell array region of the NAND Flash memory device;
a second non-linear shaped conductive line, following a profile of the first non-linear shaped conductive line, the second non-linear shaped conductive line electrically coupled to the second contact pad, the second non-linear shaped conductive line extending from the second contact pad to the memory block in the cell array region; and
a dummy conductive pattern that ends short of ends of the first and second contact pads between the first non-linear shaped conductive line and the second non-linear shaped conductive line.

20. The NAND Flash memory device of claim 19 wherein the dummy conductive pattern comprises a U shaped dummy conductive line including an opening that faces toward a space between the first and second contact pads.

* * * * *